(12) United States Patent
Li et al.

(10) Patent No.: US 11,858,816 B2
(45) Date of Patent: Jan. 2, 2024

(54) DENDRITIC MATERIALS WITH HIERARCHICAL POROSITY

(71) Applicant: BOARD OF REGENTS, THE UNIVERSITY OF TEXAS SYSTEM, Austin, TX (US)

(72) Inventors: Weigu Li, Austin, TX (US); Donglei Fan, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 17/883,851

(22) Filed: Aug. 9, 2022

(65) Prior Publication Data

US 2023/0053249 A1 Feb. 16, 2023

Related U.S. Application Data

(62) Division of application No. 16/491,748, filed as application No. PCT/US2018/021494 on Mar. 8, 2018, now Pat. No. 11,427,474.

(60) Provisional application No. 62/468,603, filed on Mar. 8, 2017.

(51) Int. Cl.
| | |
|---|---|
| *C01B 32/205* | (2017.01) |
| *C23C 16/26* | (2006.01) |
| *C25D 1/00* | (2006.01) |
| *H01G 11/24* | (2013.01) |
| *H01G 11/36* | (2013.01) |
| *H01G 11/86* | (2013.01) |
| *B82Y 40/00* | (2011.01) |
| *B82Y 30/00* | (2011.01) |

(52) U.S. Cl.
CPC ............ *C01B 32/205* (2017.08); *B82Y 30/00* (2013.01); *B82Y 40/00* (2013.01); *C23C 16/26* (2013.01); *C25D 1/003* (2013.01); *C25D 1/006* (2013.01); *H01G 11/24* (2013.01); *H01G 11/36* (2013.01); *H01G 11/86* (2013.01); *C01P 2002/72* (2013.01); *C01P 2002/85* (2013.01); *C01P 2004/03* (2013.01); *C01P 2006/10* (2013.01); *C01P 2006/12* (2013.01); *C01P 2006/16* (2013.01); *C01P 2006/40* (2013.01)

(58) Field of Classification Search
CPC ........ C25D 1/006; H01G 11/32; H01G 11/36; H01G 13/06; B82Y 40/00; C01B 32/20; C23C 16/26
USPC ............................ 428/315.9; 423/445 R, 448
See application file for complete search history.

(56) References Cited

U.S. PATENT DOCUMENTS

| | | | |
|---|---|---|---|
| 2015/0360952 A1 | 12/2015 | Fan et al. | |
| 2016/0344010 A1* | 11/2016 | Zhamu | .................. H01M 10/05 |
| 2017/0008769 A1 | 1/2017 | Otter et al. | |

OTHER PUBLICATIONS

Cheng, Y. et al. "Synergistic Effects from Graphene and Carbon Nanotubes Enable Flexible and Robust Electrodes for High-Performance Supercapacitors" Nano Lett. 2012, 12, 4206.

(Continued)

*Primary Examiner* — Tri V Nguyen
(74) *Attorney, Agent, or Firm* — Meunier Carlin & Curfman LLC

(57) ABSTRACT

Disclosed herein are dendritically porous three-dimensional structures, including hierarchical dendritically porous three-dimensional structures. The structures include metal foams and graphite structures, and are useful in energy storage devices as well as chemical catalysis.

19 Claims, 22 Drawing Sheets

(56) References Cited

OTHER PUBLICATIONS

Dong, X. et al. "Synthesis of a MnO2-graphene foam hybrid with controlled MnO2 particle shape and its use as a supercapacitor electrode" Carbon 2012, 50, 4865.

He, Y. et al. "Freestanding Three-Dimensional Graphene/MnO2 Composite Networks As Ultralight and Flexible Supercapacitor Electrodes" ACS Nano 2013, 7, 174.

Lee, J. W. et al. "A Facile and Template-Free Hydrothermal Synthesis of Mn3O4 Nanorods on Graphene Sheets for Supercapacitor Electrodes with Long Cycle Stability" Chem. Mater. 2012, 24, 1158.

Li, W. et al. "Ultralight and Binder-Free All-Solid-State Flexible Supercapacitors for Powering Wearable Strain Sensors" Adv. Funct. Mater. 2017, 27, 1702738.

Li, Z. et al. "Electrostatic layer-by-layer self-assembly multilayer films based on graphene and manganese dioxide sheets as novel electrode materials for supercapacitors" J. Mater. Chem. 2011, 21, 3397.

Liu, J. et al. "High-performance flexible asymmetric supercapacitors based on a new graphene foam/carbon nanotube hybrid film" Energy Environ. Sci. 2014, 7, 3709.

Qin, T. et al. "Freestanding flexible graphene foams@polypyrrole@MnO2 electrodes for highperformance supercapacitors" J. Mater. Chem. A 2016, 4, 9196.

Sun, X. et al. "MnO2 nanoflakes grown on 3D graphite network for enhanced electrocapacitive performance" RSC Adv. 2014, 4, 30233.

Xia, X. et al. "A New Type of Porous Graphite Foams and Their Integrated Composites with Oxide/Polymer Core/Shell Nanowires for Supercapacitors: Structural Design, Fabrication, and Full Supercapacitor Demonstrations" Nano Lett. 2014, 14, 1651.

Yang, X. et al. "Mn3O4 nanocrystalline/graphene hybrid electrode with high capacitance" Electrochim. Acta 2016, 188, 398.

Zhu, G. et al. "Highly conductive three-dimensional MnO2-carbon nanotube-graphene-Ni hybrid foam as a binder-free supercapacitor electrode" Nanoscale 2014, 6, 1079.

International Search Report and Written Opinion dated May 25, 2018, from International Application No. PCT/US2018/021494, 9 pages.

Hengxing, J. et al. "Ultrathin Graphite Foam: A Three-Dimensional Conductive Network for Battery Electrodes", Nano Letters, vol. 12, pp. 2446-2451 (2012).

* cited by examiner

DENDRITIC MATERIALS WITH HIERARCHICAL POROSITY

CROSS-REFERENCE TO RELATED APPLICATIONS

This application is a divisional of U.S. application Ser. No. 16/491,748, filed on Sep. 6, 2019, which is a 371 of PCT/US2018/021494, filed Mar. 8, 2018, which claims the benefit of U.S. Provisional Application 62/468,603, filed on Mar. 8, 2017, the contents of which are hereby incorporated in their entirety.

STATEMENT OF FEDERALLY FUNDED RESEARCH

This invention was made with government support under Grant No. CMMI1150767 awarded by the National Science Foundation. The government has certain rights in the invention.

FIELD OF THE INVENTION

The present invention relates the dendritic nanoporous materials, in particular to dendritic metal foams and graphite structures. The foams and structures can have hierarchical porous structures, including hierarchical micro/nano porous dendritic architectures.

BACKGROUND

The depletion of fossil energy and the associated adverse environmental impacts make it highly desirable to explore renewable-energy technologies. Carbonaceous materials with various morphologies and chemistries, such as carbon nanotubes, bucky balls, graphene, and thin graphite, have emerged as key structures for energy storage and conversion devices. Among them, thin graphite has received considerable interest as electrode supports owing to its high electric conductivity, excellent mechanical durability, and ultra-low mass density. However, it remains a challenge to rationally and efficiently synthesize carbonaceous materials into 3-D porous nanosuperstructures, having both high specific surface areas and fast ionic transports. High specific surface area is an especially attractive goal as it increases electrolyte access to the active material in a battery, thereby improving performance.

Intensive research has demonstrated the ultra-large specific surface area of graphene and its usage in energy devices, such as supercapacitors. Nevertheless, the assembly of graphene sheets is difficult to control, which can reduce the actual available surface areas and lower the device performance.

Three-dimensional graphite structures with controlled porosity have been reported. The structures were obtained by plating a metal layer on a nickel, iron or cobalt foam substrate; annealing the metal and foam into a porous catalyst with a smooth surface and porous interior; etching the smooth surface of the annealed porous catalyst to expose porous microstructures; growing a carbonaceous layer on the porous surfaces of the catalyst; and completely etching the catalyst to obtain the graphite structure.

Porous metal foams are useful in their own right in a variety of different applications. Porous metal foams can be applied as electrode supports to enhance performance of devices such as supercapacitors and catalytic energy devices, such as fuel cells. Additionally, porous metal foams are potential alternatives for precious metal catalysts, which are widely used in a variety of important industrial chemical transformations such as hydrogenation, ammonolysis, reductive alkylations and dehydrogenations.

There is a need for improved metal foams and graphite structures having controllable porosity levels and/or increased surface areas. There is a need for practical methods for preparing metal foams and graphite structures having controllable porosity levels and/or increased surface areas.

SUMMARY

Disclosed herein are improved metal foams and graphite structures having controllable porosity levels and/or increased surface areas. The foams and structures include porous dendritic struts radiating from their surfaces, which dramatically increase the available surface area of the foams and structures.

The details of one or more embodiments are set forth in the descriptions below. Other features, objects, and advantages will be apparent from the description and from the claims.

DETAILED DESCRIPTION

Figure 1:
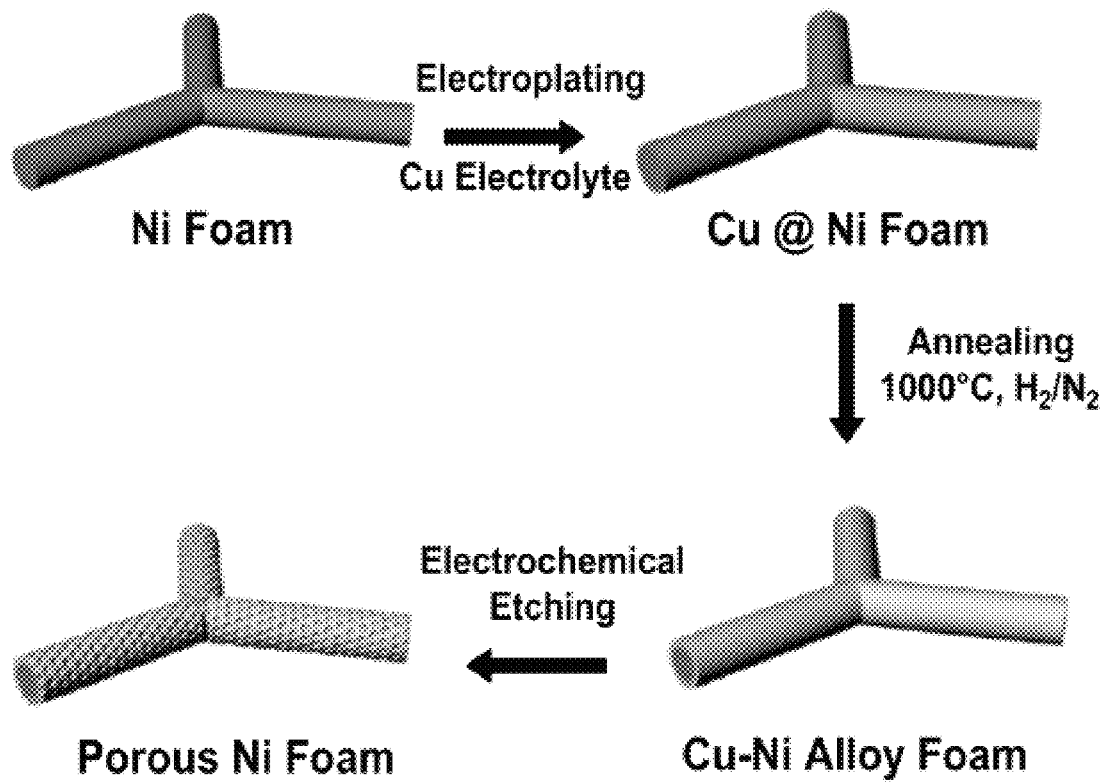
FIG. 1 includes a schematic illustration of the fabrication of a porous nickel foam.
Figure 2A:
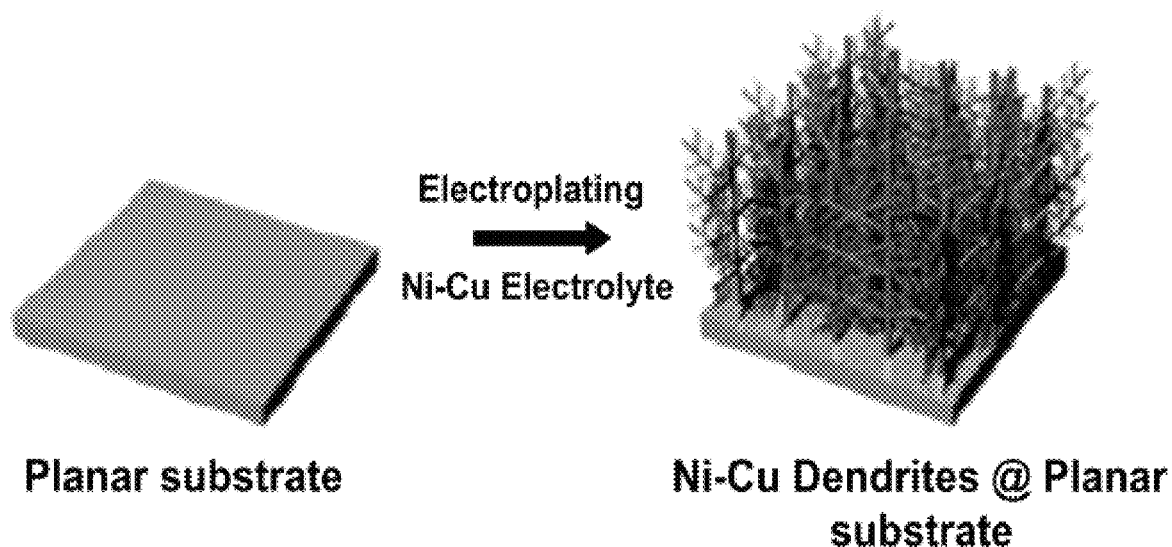
FIG. 2A includes a schematic illustration of nickel-copper dendrite growth upon a planar substrate.
Figure 2B:
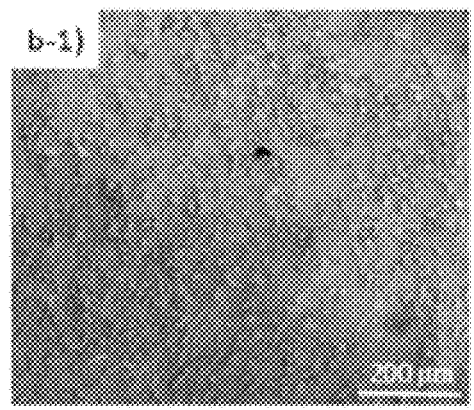
FIG. 2B, FIG. 2C and FIG. 2D include SEM images of nickel-copper dendrites radiating form a planar surface.
Figure 2C:
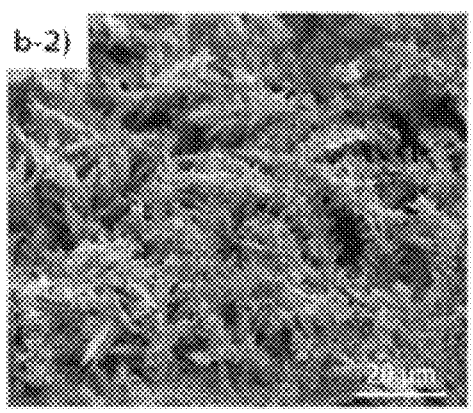
Figure 2D:
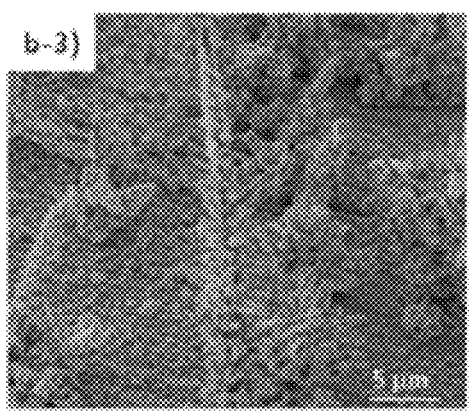
Figure 3A:
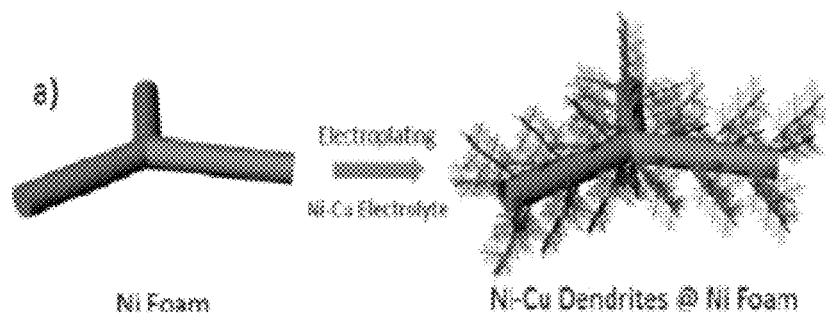
FIG. 3A includes a schematic illustration of nickel-copper dendrite growth upon a metal foam.
Figure 3B:
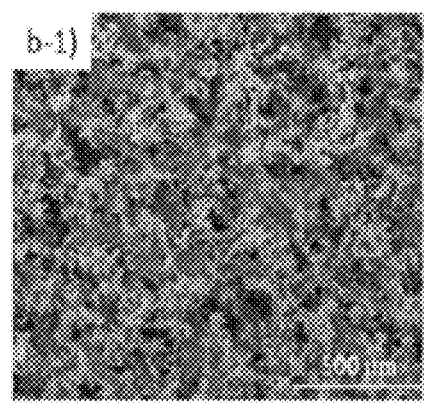
FIG. 3B, FIG. 3C and FIG. 3D include SEM images of nickel-copper dendrites radiating from a nickel foam.
Figure 3C:
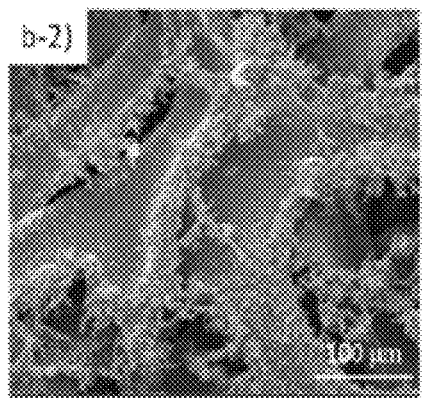
Figure 3D:
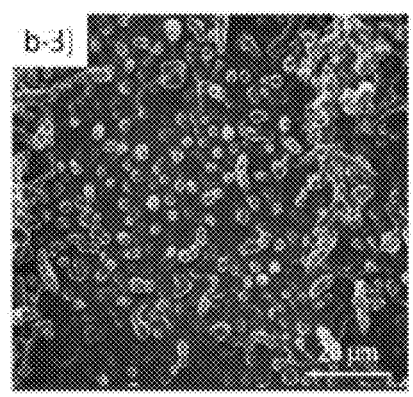
Figure 4A:
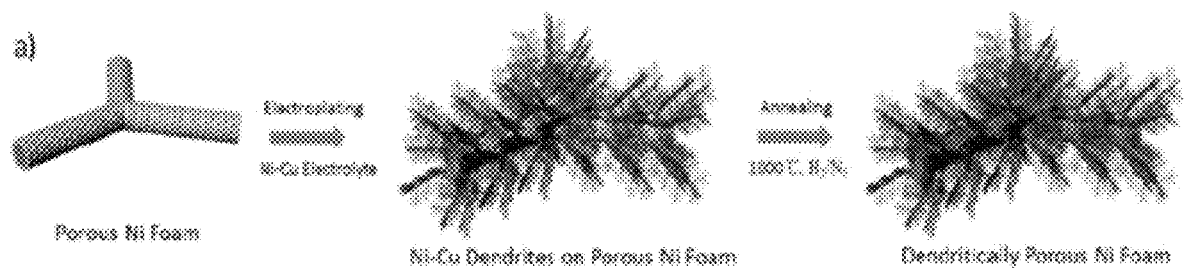
FIG. 4A includes a schematic illustration of nickel-copper dendrite growth upon a metal foam, followed by annealing to give a dendritically porous nickel foam.
Figure 4B:
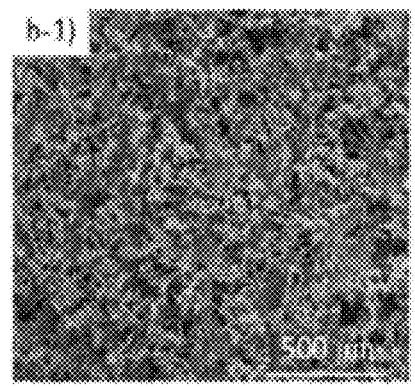
FIG. 4B, FIG. 4C and FIG. 4D include SEM images of a dendritically porous nickel foam.
Figure 4C:
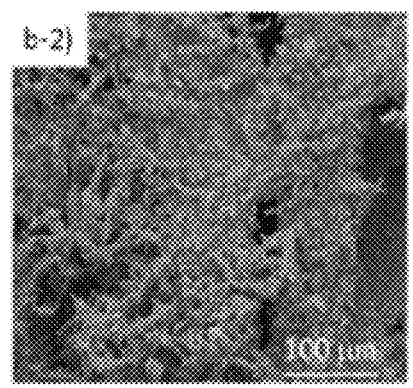
Figure 4D:
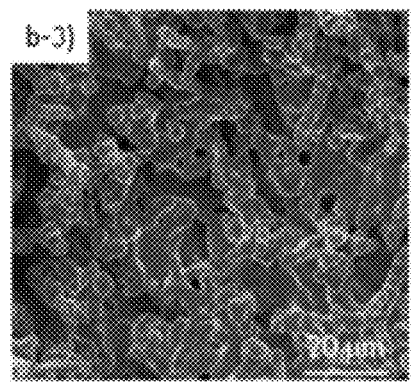
Figure 5A:
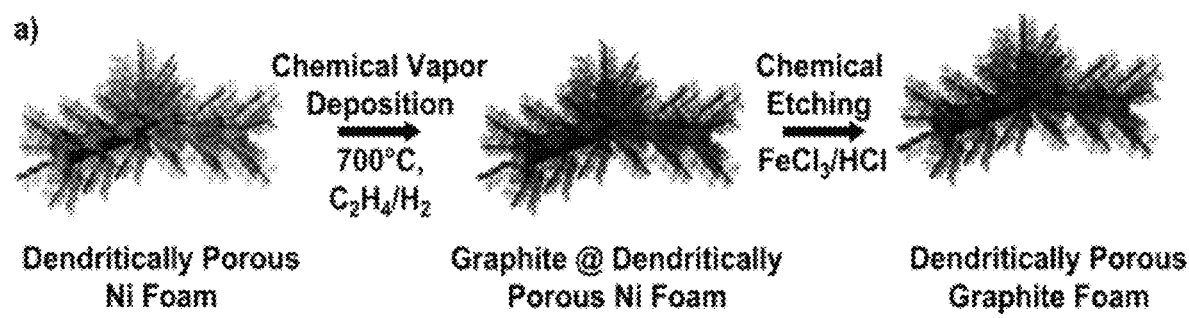
FIG. 5A includes a schematic illustration of the conversion of a dendritically porous nickel foam into a dendritically porous graphite foam.
Figure 5B:
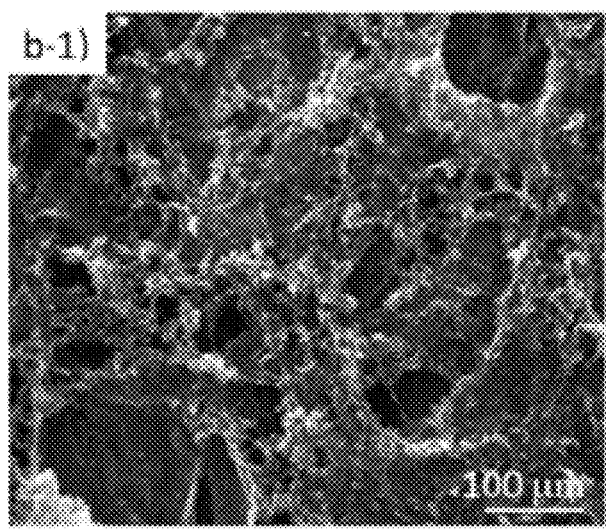
FIG. 5B and FIG. 5C include SEM images of a dendritically porous graphite foam.
Figure 5C:
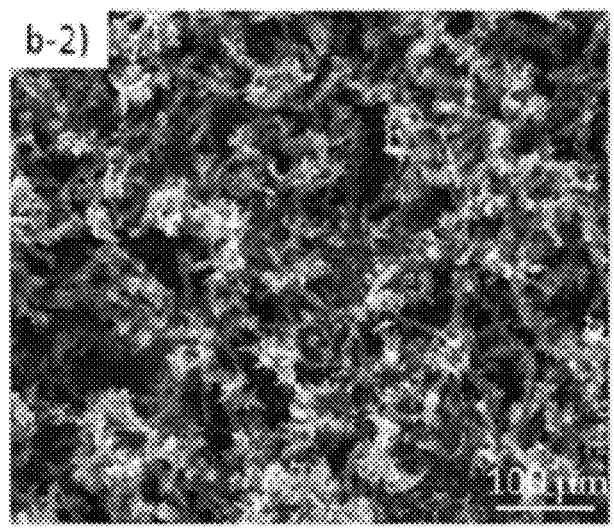
Figure 6:
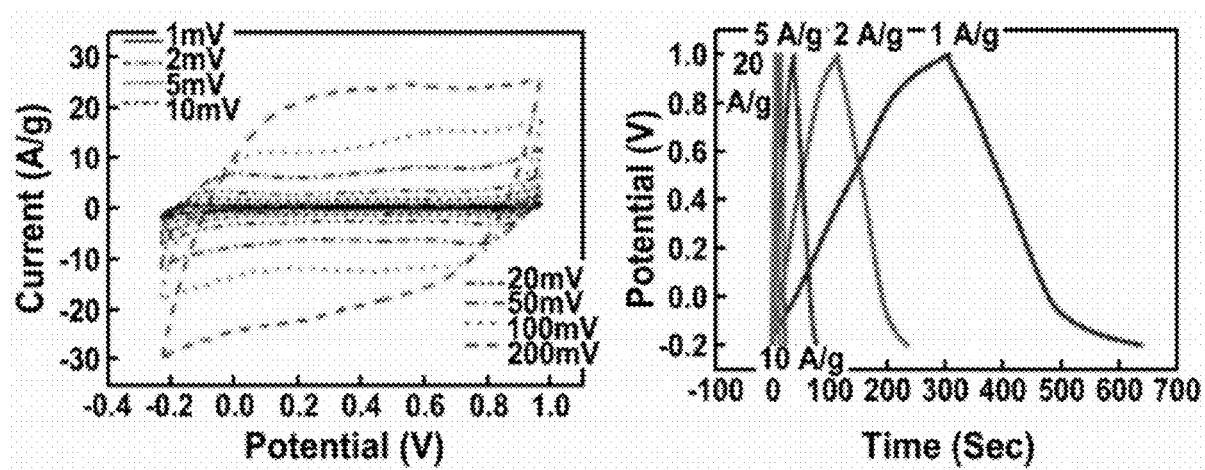
FIG. 6 includes a depiction of a cyclic voltammetry curves and galvanostatic charge-discharge curves of a dendritically porous graphite foam.
Figure 7:
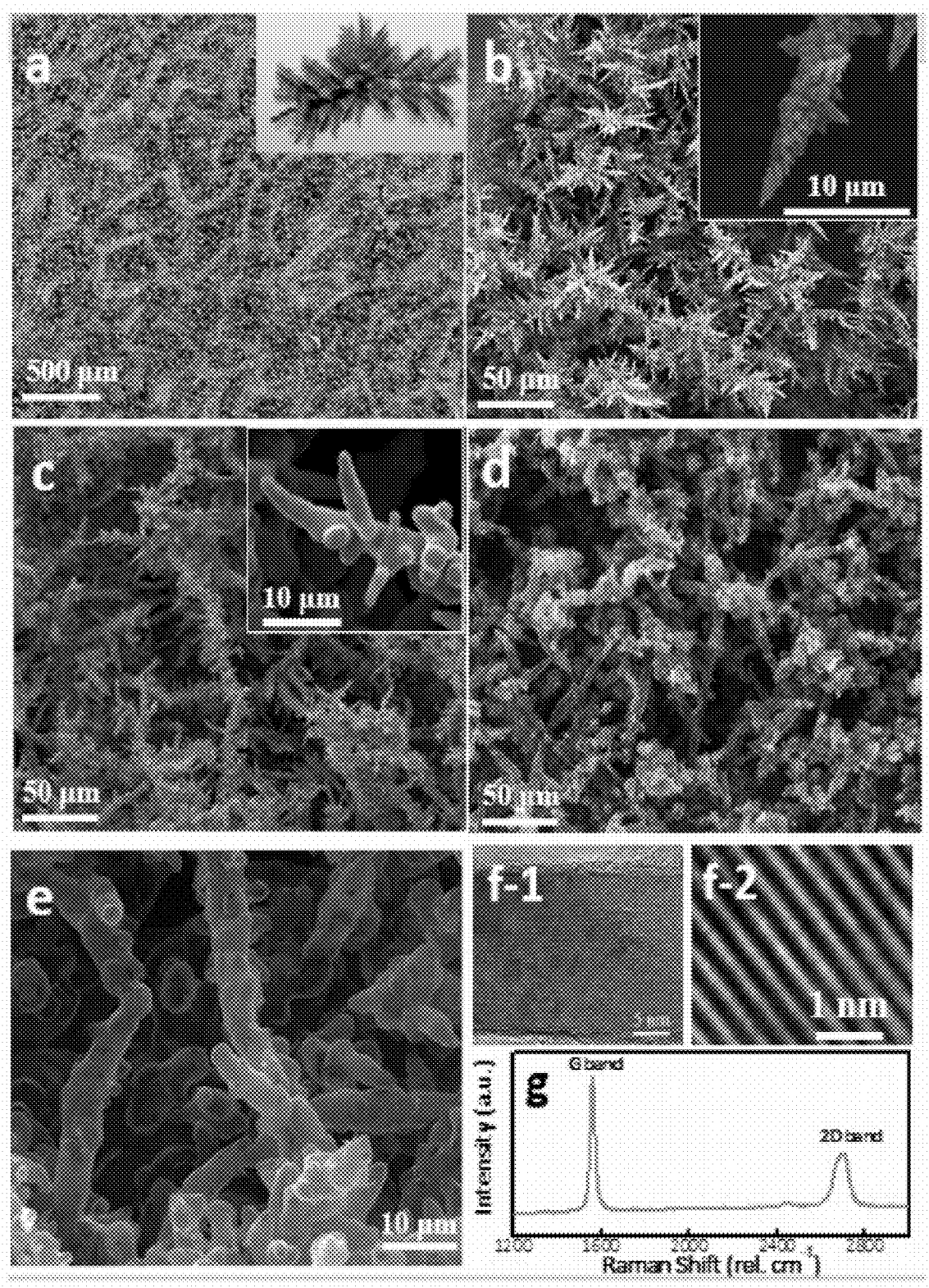
FIG. 7 includes scanning electron microscopy (SEM) images of dendritic porous Cu—Ni foams: (a, b) before and (c) after annealing; (d, e) SEM images of dendritic porous graphite foam ("3D RPGF"), replicating the structures of the 3-D Cu—Ni foam catalyst; (f-1 and f-2) depict high-resolution transmission electron microscopy (HRTEM) images and (g) Raman spectrum of RPGFs showing the high crystallinity.
Figure 8:
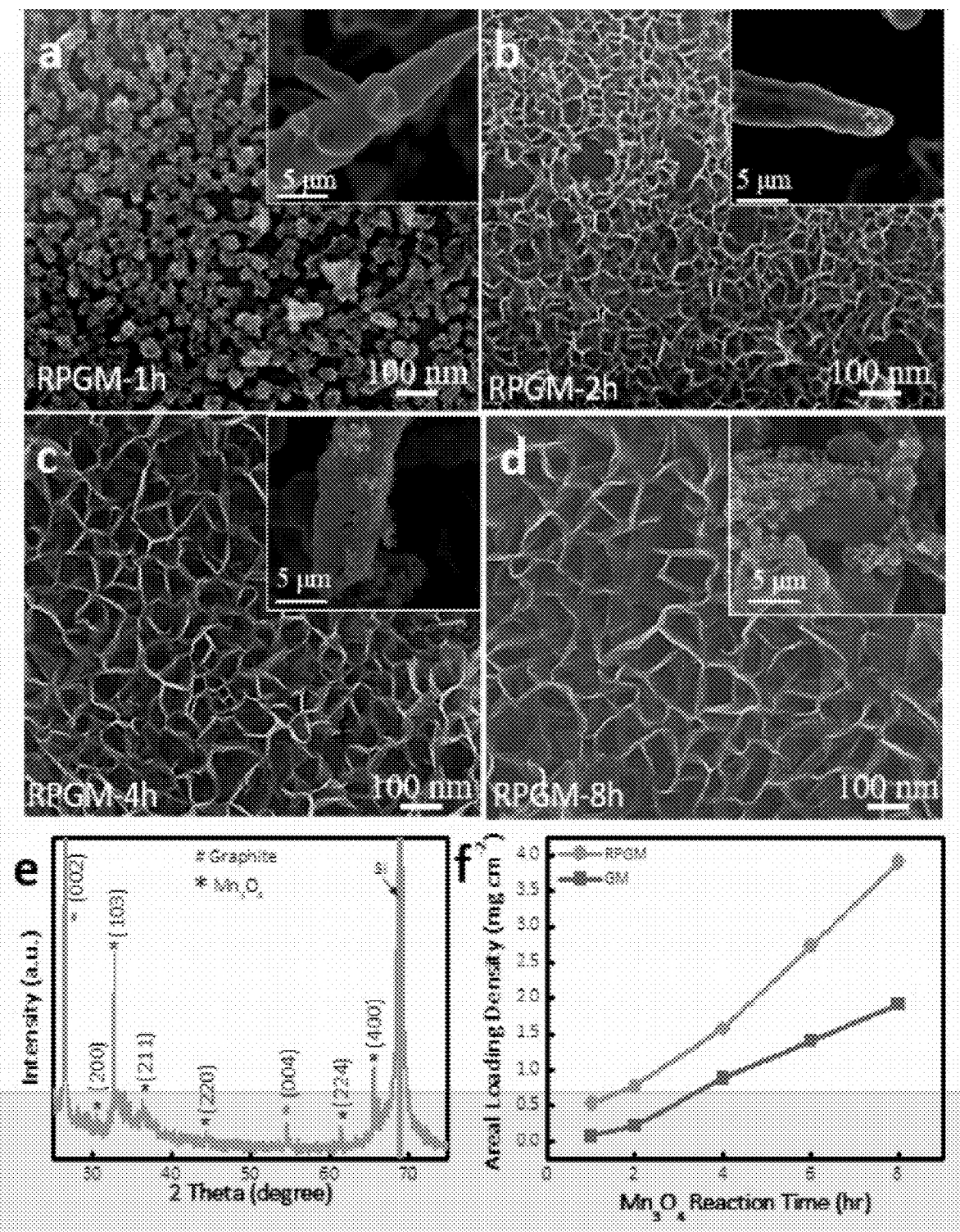
FIG. 8 includes SEM images of dendritic porous graphite/$Mn_3O_4$ ("RPGM") composite with different growth time of $Mn_3O_4$ (a: 1 hour reaction time, b: 2 hour reaction time, c: 4 hour reaction time, d: 8 hour reaction time); (e) X-ray diffraction (XRD) of the obtained graphite/$Mn_3O_4$ composite on Si substrate; (f) Areal loading density of $Mn_3O_4$ on RPGM (dendritically porous graphite foam base) and GM (conventional graphite foam base).

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

Disclosed herein are three-dimensional porous substrates having porous struts radiating from the surfaces of the substrate. The struts can radiate from the outer surface of the substrate, as well as from the surfaces of the pores permeating the substrate. Exemplary struts include dendrites, which include branched structures and acicular structures radiating from the substrate. As used herein, the term "ramified" refers to object bearing dendritic structures. The struts can be attached to the substrate at a single point of attachment, and individual struts are not connected to other struts. The porous dendrites can have an average pore size from 1-10,000 nm, 1-5,000 nm, 1-2,500 nm, 1-2,000 nm, 1-1,500 nm, 1-1,000 nm, 10-1,000 nm, 100-1,000 nm, 100-500 nm, 500-1,000 nm, or 500-2,000 nm. The substrate and struts can include materials such as graphite, conductive metals, silicon and conductive polymers. Exemplary conductive metals include copper, nickel, iron, cobalt, gold, platinum, rhodium, and mixtures thereof. Exemplary conductive polymers include poly(pyrrole), poly(acetylene), poly(phenylene vinylene), poly(thiophene), poly(3,4-ethylenedioxythiophene), poly(aniline), poly(phenylene sulfide), and mixtures thereof. In some instances, the substrate and struts may be made of the same material, wherein in others the substrate and struts are made of different materials. Three dimensional substrates include those in which the shortest dimension is at least 100 μm, at least 200 μm, at least 300 μm, at least 400 μm, at least 500 μm, at least 600 μm, at least 700 μm, at least 800 μm, at least 900 μm, or at least 1,000 μm thick.

The substrate may include a porous foam, for instance a three dimensional foam. Three-dimensional foams can have an average pore size from 1-1,000 μm, 10-1,000 μm, 10-500 μm, 50-500 μm, or 100-500 μm. The substrate can have a multilevel porosity, for instance a core level having a first porosity, and a shell level having a second porosity. The core can have an average pore size from 1-1,000 μm, 10-1,000 μm, 10-500 μm, 50-500 μm, or 100-500 μm. The core can include materials such as graphite, conductive metals, silicon and conductive polymers. In some instances the pores in the shell are smaller than the pores in the core, for instance, the shell can have an average pore size that is less than 50%, 40%, 30%, 20%, 10%, 5%, or 1% the average pore size of the pores in the core. In some embodiments, the shell portion has an average pore size from 1-100 μm, 1-50 μm, 1-25 μm, 2-25 μm, 2-15 μm, 2-10 μm, 2-8 μm, 2-5 μm, 5-25 μm, 5-15 μm, 5-10 μm or 5-8 μm. The shell can include materials such as graphite, conductive metals, silicon and conductive polymers. In some instances, the core and the shell are made from the same materials, whereas in other cases the core is made of a different material than the shell. In certain embodiments, the core, shell, and dendrites are all porous graphite, while in other embodiments the core, shell, and dendrites are all porous metal. Preferred metals include nickel, copper, and mixtures thereof. When the shell and core are the same material, the two levels will typically have different porosities. However, the shell and core are different materials, they may have the same porosities, or different porosities.

The porous dendritic structures are characterized by high surface area. For instance, the structures can have a BET surface area of at least 5.0 m$^2$/g, at least 5.5 m$^2$/g, at least 6.0 m$^2$/g, at least 6.5 m$^2$/g, at least 7.0 m$^2$/g, at least 7.5 m$^2$/g, at least 8.0 m$^2$/g, at least 8.5 m$^2$/g, at least 9.0 m$^2$/g, at least 9.5 m$^2$/g, or at least 10.0 m$^2$/g. In some instances, the structures can have an areal density of at least 0.01 mg$^2$/cm, at least 0.05 mg$^2$/cm, at least 0.10 mg$^2$/cm, at least 0.15 mg$^2$/cm, at least 0.20 mg$^2$/cm, at least 0.25 mg$^2$/cm, at least 0.30 mg$^2$/cm, at least 0.35 mg$^2$/cm, at least 0.40 mg$^2$/cm, at least 0.45 mg$^2$/cm, or at least 0.50 mg$^2$/cm. In some embodiments, the substrate can have a volumetric surface area of at least 0.01 m$^2$/cm$^3$, at least 0.05 m$^2$ cm$^3$, at least 0.10 m$^2$/cm$^3$, at least 0.15 m$^2$/cm$^3$, at least 0.20 m$^2$/cm$^3$, at least 0.25 m$^2$/cm$^3$, at least 0.30 m$^2$/cm$^3$, at least 0.35 m$^2$/cm$^3$, at least 0.40 m$^2$/cm$^3$, at least 0.45 m$^2$/cm$^3$, at least 0.50 m$^2$/cm$^3$, at least 0.55 m$^2$/cm$^3$, at least 0.60 m$^2$/cm$^3$, at least 0.65 m$^2$/cm$^3$, at least 0.70 m$^2$/cm$^3$, at least 0.75 m$^2$/cm$^3$, at least 0.80 m$^2$/cm$^3$, at least 0.85 m$^2$/cm$^3$, at least 0.90 m$^2$/cm$^3$, at least 0.95 m$^2$/cm$^3$, or at least 1.0 m$^2$/cm$^3$.

The BET surface area, areal density, and volumetric surface area can be determined using the 5-point BET surface area test, such as performed by Pacific Surface Science Inc. Samples are prepared with nitrogen gas at 200° C. for 2 hours before test. The 5-point BET test is carried out by nitrogen adsorption at 77K. To obtain data with different units shown as above the planar area, mass, and volume of a sample can be combined with the total surface area of the sample (as provided by Pacific Surface Science Inc.).

The three-dimensional porous substrates having porous struts radiating from the surfaces of the substrate can be obtained by depositing struts on the surface of a conductive substrate. The conductive substrate can be a commercially available metal foam, for instance a nickel foam, a copper foam, an iron foam, a zinc foam, an aluminum foam, or a tin foam. In some embodiments, the substrate can be a multi-layered three-dimensional substrate, for instance a core-shell substrate. The substrate can be immersed in an electrolyte solution, wherein the electrolyte solution is in electrical communication with an electrode. The electrolyte solution can include metal ions, such as copper ions, nickel ions, cobalt ions, and mixtures thereof. The ions can be provided in the form of metal salts. An electric current can be applied via the electrode in order to precipitate dissolved ions onto the surfaces of the substrate in the shape of dendritic structures.

The size and shape of the dendritic structures can be tuned by controlling the parameters of the electrochemical deposition. In some instances, the electrodeposition is conducted at an applied current of at least −25 mA, at least −50 mA, at least −75 mA, at least −100 mA, at least −125 mA, at least −150 mA, at least −175 mA, or at least −200 mA. The electrodeposition can include an applied voltage from −2.5 V-2.5 V, from −2.0 V-2.5 V, from −1.5 V-2.5 V, from −1.0 V-2.5 V, from −1.0 V-2.0 V, or from −1.0 V-1.9 V. The electrodeposition can include depositing on the substrate from 25-500 C/in$^2$, from 25-400 C/in$^2$, from 25-300 C/in$^2$, from 50-300 C/in$^2$, from 50-200 C/in$^2$, from 50-150 C/in$^2$, from 75-150 C/in$^2$, from 75-125 C/in$^2$, from 100-125 C/in$^2$, relative to the surface area of the substrate.

In some embodiments, the electrodeposition can be conducted over a series of electrodeposition cycles. After a period of electrodeposition, the substrate is rotated relative to the electrode, followed by additional electrodeposition. The substrate can be rotated 30°, 60°, 90°, 120°, 150°, or 180° relative to the electrode, and can be rotated along one or two axes. For instance, the substrate can be rotated 180° along two axes. The electrodeposition can be conducted over at least 2, 3, 4, 5, 6, 7, 8, 9 or 10 cycles. In some instances, the current is discontinued during the rotation phases, while in others, the substrate is rotated while the current is still applied. In yet other embodiments, the substrate is continuously rotated over the course of electrodeposition. By rotating the substrate a more uniform deposition of dendrites can be achieved.

After depositing the dendrites on the substrate, the substrate/dendrites can be annealed to give a dendritically porous foam. Typical annealing conditions include heating the dendritic substrate under a gas flow, for instance hydrogen, nitrogen, and mixtures thereof. Exemplary gases include H$_2$ at 1-10 sccm, 2-8 sccm, 3-7 sscm or 5 sccm, in combination with N$_2$ at 1-100 sccm, 10-90 sccm, 25-75 sccm, 40-60 sccm, or 50 sccm. The annealing can be conducted at a temperature between 500-1,500° C., between about 750-1,250° C., or between about 900-1,100° C. The heating can be performed for at least 1 minute, at least 2 minutes, at least 5 minutes, or at least 10 minutes, for instance, for about 1-20 minutes, 1-15 minutes, 2-15 minutes, 2-10 minutes, 2-8 minutes, or 3-7 minutes.

The graphite network can be obtained using chemical vapor deposition or hydrothermal deposition. For instance, chemical vapor deposition can be performed with a carbon source, such as a $C_{2-4}$ hydrocarbon, including, but not limited to, ethylene, acetylene, propylene, propyne, butadiene and mixtures thereof. The deposition can be conducted using a carrier gas, for instance hydrogen. Generally, the deposition can be conducted at a temperature less than about 1,000° C., less than about 900° C., less than about 850° C., less than about 800° C., less than about 750° C., less than about 700° C., less than about 650° C., less than about 600° C., less than about 550° C., or less than about 500° C. In some embodiments, the deposition can be conducted at a temperature between about 500-1,000° C., between about 500-900° C., between about 600-900° C., between about 600-800° C., or between about 650-750° C. In some instances, the deposition is conducted at a temperature around 700° C.

The thickness of the struts can be controlled by varying the deposition conditions, such as growth time. The thickness of struts is determined by measuring the areal density of the obtained samples. The deposition can be conducted for at least 1 hour, at least 2 hours, at least 5 hours, at least 10 hours, or at least 15 hours. For instance, the deposition may be conducted for 1-20 hours, 2-20 hours, 2-15 hours, 5-15 hours, or 10-15 hours.

After the graphite network has been prepare, the substrate can be removed to give a dendritic graphite structure. In the case of metal foams, the substrate can be removed by etching, for instance chemical etching, such as with one or more acids. In some instances, the substrate can be removed by treatment with a mineral acid, such as HCl, HBr, HI, HF, $HNO_3$, $H_2SO_4$, $H_3PO_4$, and mixtures thereof, optionally in combination with one or more Lewis acids, for instance a transition metal salt such as $FeCl_3$, $FeBr_3$, $BCl_3$, $BF_3$, $AlCl_3$, $AlBr_3$, $Al(OiPr)_3$, $SnCl_r$, $TiCl_4$, or $Ti(OiPr)_4$.

The dendritic graphite foams can be combined with a variety of active materials to prepare supercapacitor electrodes. As used herein, such materials can be designated dendritic graphite foam composites ("RPGM"). Suitable active materials include manganese oxides like $MnO_2$ and $Mn_3O_4$, cobalt oxides like $Co_3O_4$, ruthenium oxides like NiO, ferric oxides like $Fe_3O_4$, as well as mixed metal oxides like $NiCo_2O_4$ and $MnFe_2O_4$. The active material may be deposited on the surface of the dendritic graphite foams as nanoparticles using conventional techniques, for instance hydrothermal reaction. The loading efficiency of the dendritic graphite foams is substantially improved over conventional foams. Conventional foam composites can be designated "GM." For instance, the active material can be loaded in an amount greater than 0.5 mg/cm$^2$, greater than 1.0 mg/cm$^2$, greater than 1.5 mg/cm$^2$, greater than 2.0 mg/cm$^2$, greater than 2.5 mg/cm$^2$, greater than 3.0 mg/cm$^2$, greater than 3.5 mg/cm$^2$, greater than 4.0 mg/cm$^2$, greater than 4.5 mg/cm$^2$, or greater than 5.0 mg/cm$^2$. After loading, the active material can constitute at least 50%, at least 60%, at least 70%, at least 80%, or at least 90% of the total weight of the graphite/active material composite. In some embodiments, the active material is loaded in an amount greater than 3 mg/cm$^2$ and constitutes at least 70% of the total weight of the graphite/active material composite. In other embodiments, the active material is loaded in an amount greater than 3.5 mg/cm$^2$ and constitutes at least 75% of the total weight of the graphite/active material composite. In preferred embodiments, the active material is loaded in an amount greater than 4.0 mg/cm$^2$ and constitutes at least 80% of the total weight of the graphite/active material composite.

Figure 9:
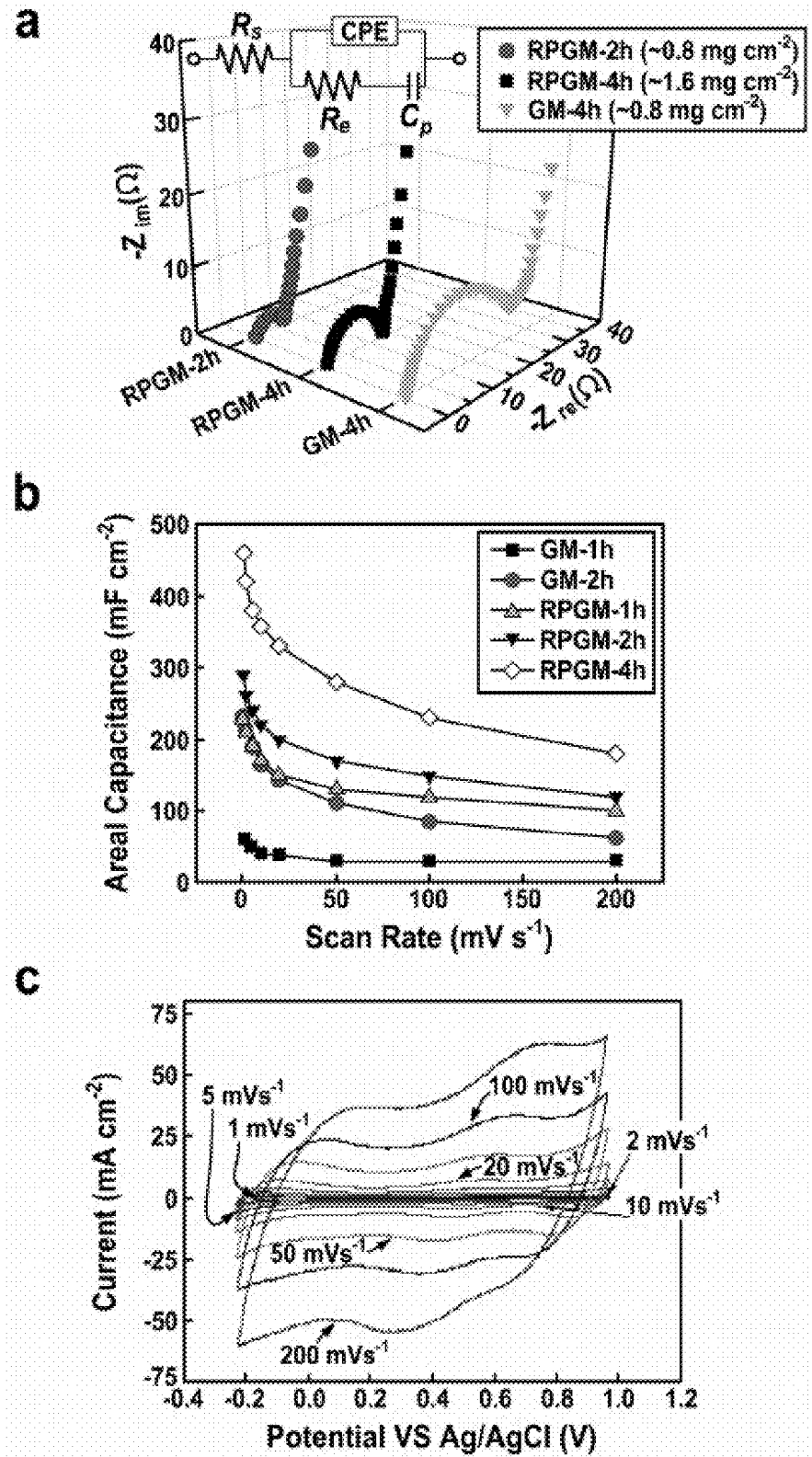
FIG. 9 includes a comparison between RPGM and GM with similar loading density and reaction time: (a) electrochemical impedance spectroscopy; inset: equivalent circuit, $R_s$—series resistance, $R_c$—charge transfer resistance, $C_p$—pseudocapacitive element due to redox process of $Mn_3O_4$, CPE—Constant phase element from double-layer capacitance); (b) areal capacitance versus scan rate; (c, d) CV and GCD curves of RPGM-4h; (e) Areal capacitance of RPGM at different scan rate versus reaction time of $Mn_3O_4$; (f) Retention of 80% of capacitance after charging and discharging for 3000 cycles (top) ~100% of coulombic efficiency (bottom) of RPGM-8h at 10 A $g^{-1}$.
Figure 9:
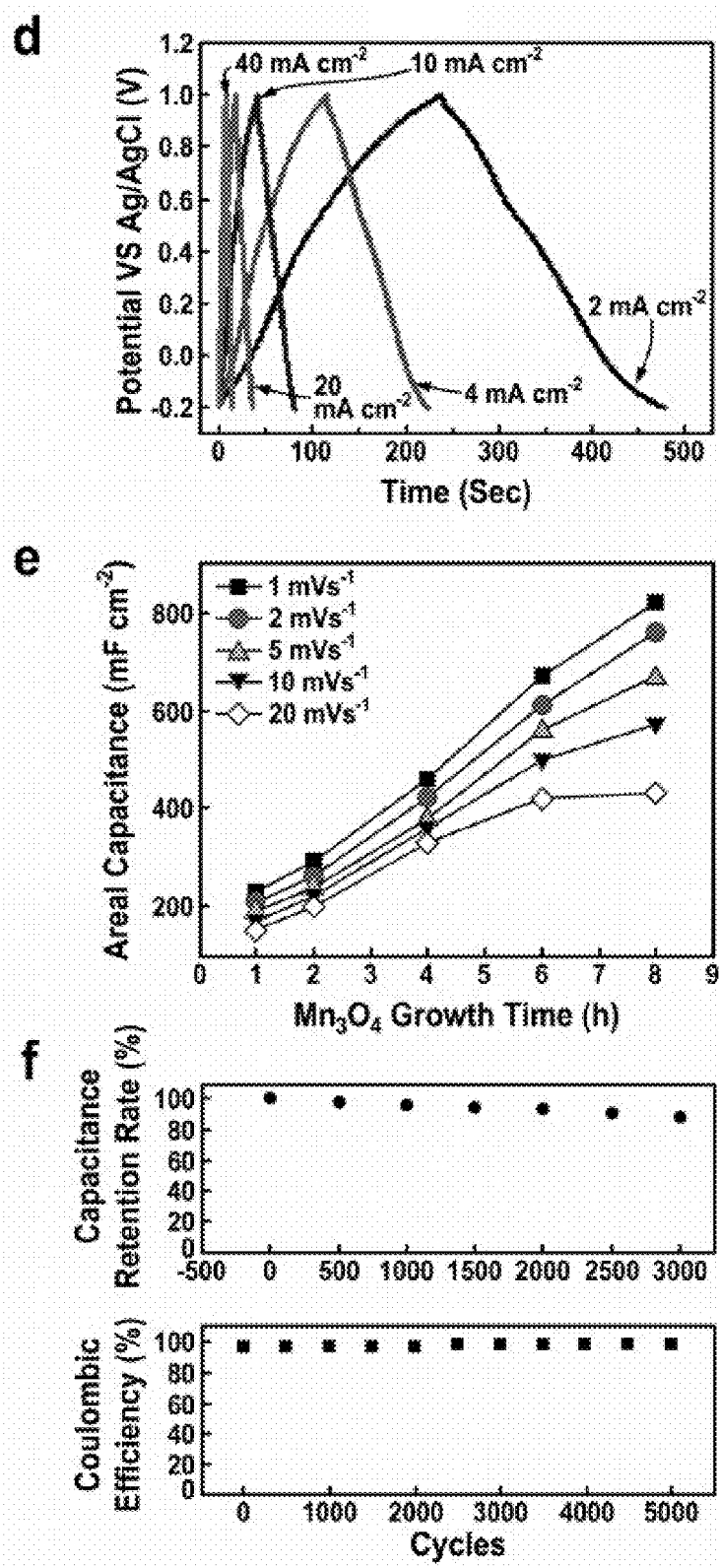

The dendritic graphite foam composites are more electrically conductive than GM composites with similar loading density and growth time of active materials such as $Mn_3O_4$ nanoparticles [FIG. 9a]. It has been demonstrated that an increase in the thickness of $Mn_3O_4$ impedes the ion diffusion and migration process, resulting in a higher charge transfer resistance. Because of the increased internal surface area provided by the diverging graphitic microbranches and micropores, dendritic graphite foams permit a much thinner and sparser coating of active material even though the loading density is the same compared to conventional graphite foams. For instance, dendritic graphite foam samples (e.g. loading density ~0.8 mg cm$^2$, $R_c$=6Ω) possess lower charge transfer resistance than that of GM samples (e.g. loading density ~0.8 mg cm$^{-2}$, $R_c$=27Ω). This is even observed for dendritic graphite foams with a higher areal loading of $Mn_3O_4$ than conventional foam, of which the reaction time is same (~1.6 mg cm$^{-2}$, $R_c$=13 Ω, 4 h reaction).

Supercapacitors can be prepared using the dendritic graphite foam composites disclosed herein as electrode material. Two dendritic graphic foam composites can be separated by an electrolyte and sandwiched between two conductive films. Suitable electrolytes include gel-based electrolytes in which the relevant electrolyte ion (lithium, sodium, potassium, ect) is dispersed in a liquid polymer such as polyethylene oxide, polyacrylonitrile, polymethyl methacrylate, polyvinylidene fluoride, and polyvinyl alcohol. Ionic liquids and conventional liquid electrolytes can also be used (e.g., an organic solvent like propylene carbonate, ethylene carbonate, diethyl carbonate, dimethyl carbonate, or ethyl methyl carbonate).

The improved electrical conductivity of dendritic graphite foams also enables enhanced pseudocapacitive performance compared to those of conventional graphite foam based composites. The shapes of CV curves of RPGM (2 h) are more rectangular and symmetric than those of GM (4 h). The number in parenthesis refers to the length of time of the loading reaction. At the same loading density of $Mn_3O_4$, the dendritic graphite foam (2 h) exhibits much higher areal capacitances (290 to 120 mF cm$^{-2}$) compared to those of conventional graphite foam (4 h) (230 to 60 mF cm$^{-2}$) at scan rates of 1-200 mV s$^{-1}$ [FIG. 9b]. The areal capacitance of dendritic graphite foam (2 h) only decreases by 59% when the scan rate increases from 1 to 200 mV s$^{-1}$, whereas the capacitance of conventional graphite foam (4 h) is attenuated by 74% at the same condition.

With a higher loading of $Mn_3O_4$ (1.57 mg/cm$^2$, 4 h reaction), an even greater areal capacitance of 460 mF cm$^{-2}$ at 1 mV s$^{-1}$ and 400 mF cm$^{-2}$ at 2 mA cm$^{-2}$ can be achieved as shown in FIG. 9c-d. The quasi-rectangular shape with small redox peaks in CV curves [FIG. 9c] is consistent with the pseudocapacitive characteristics of $Mn_3O_4$ reported previously. The GCD curves [FIG. 9d] are fairly symmetric at current densities of 2 to 40 mA cm$^{-2}$, indicating high reaction reversibility and coulombic efficiency. By extending the growth time of $Mn_3O_4$ to 6 and 8 hours, the areal capacitance of dendritic graphite foam is further improved to 670 and 820 mF cm$^{-2}$ (1 mV s$^{-1}$), respectively [FIG. 9e]. After 3,000 continuous charging and discharging cycles at 20 mA cm$^{-2}$, RPGM-8h still retains 88% of its peak areal capacitance [FIG. 9f]. Moreover, the coulombic efficiency maintains 98% after 5,000 consecutive cycles [FIG. 9f]. These results suggest a superb electrochemical stability of the dendritic graphite foam composite electrodes.

Moreover, owing to the strategically improved specific surface areas, dendritic graphite foams exhibit excellent rate capability compared to those reported previously. The dendritic graphite foam (~3.91 mg cm$^{-2}$ $Mn_3O_4$ loading, 8h reaction) offers very high capacitances of 820, 760 and 670 mF cm$^{-2}$ at the scanning rate of 1, 2 and 5 mV s$^{-1}$, respectively. More importantly, they can maintain a capacitance of 430 mF cm$^{-2}$ at a higher scan rate of 20 mV s$^{-1}$ [FIG. 9f]. In comparison, with a similar loading of 3.9 mg cm$^{-2}$, GF/CNT/$MnO_2$ composites offer capacitances of 500 and 250 mF cm$^{-2}$ at 5 and 20 mV s$^{-1}$, respectively. Though the capacitance can be improved to 750 mF cm$^{-2}$ (5 mV s$^{-1}$)

with a higher loading of the active material at 6.2 mg cm$^{-2}$, the rate capability is compromised to 280 mF cm$^{-2}$ when the scan rate is increased to 20 mV s$^{-1}$.

Figure 10:
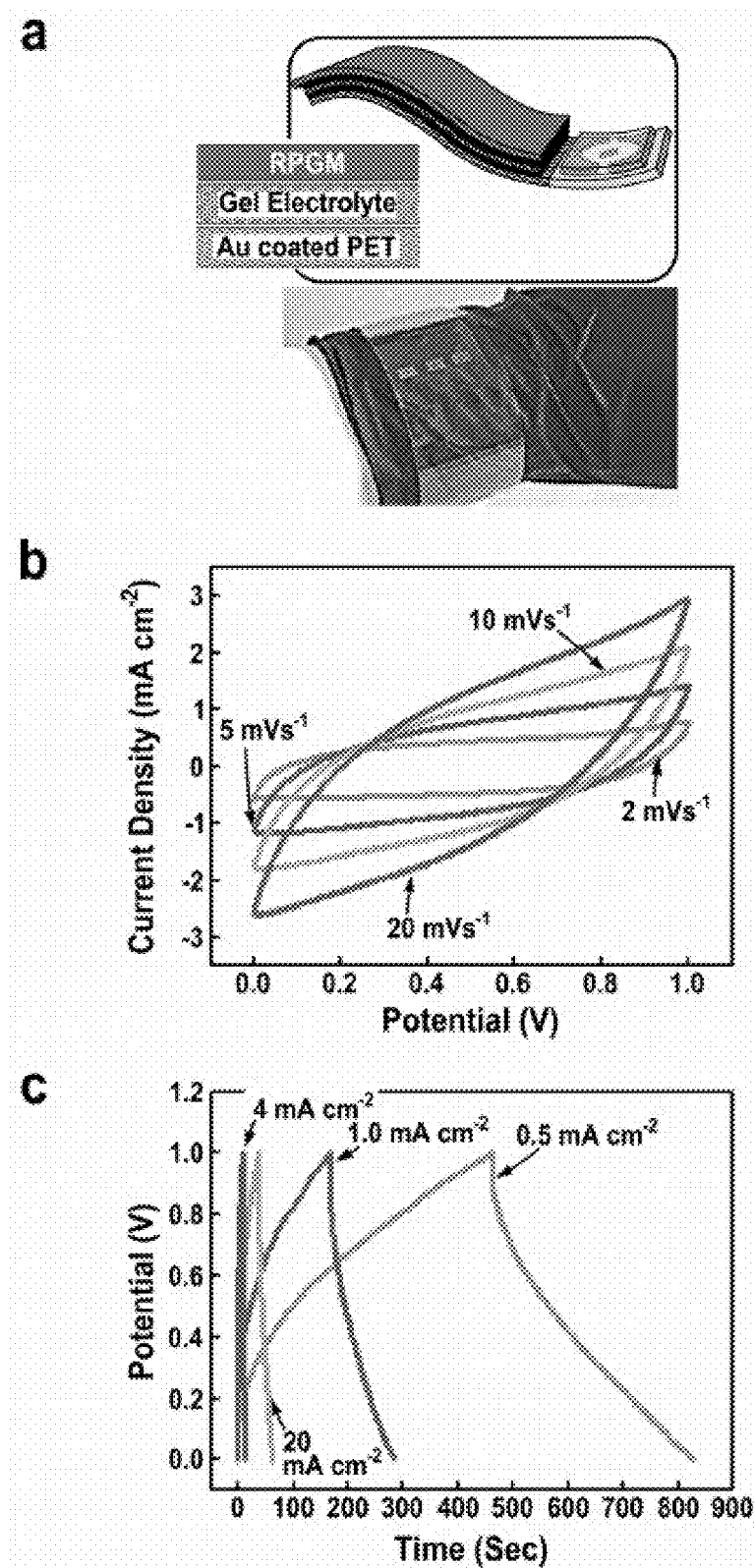
FIG. 10 includes a schematic illustration (top) and photograph (bottom) of RPGM supercapacitors for powering nanomanipulation systems on flexible substrate; (b, c) CV and GCD characterizations of RPGM-8h full cells; (d) Capacitance retention under cyclic bending of 1000 cycles with curvature of 3.5 mm, inset on the left: CV curves before and after 1,000 bending cycles. Inset on the right: digital photograph of a fully bent solid-state supercapacitor.
Figure 10:
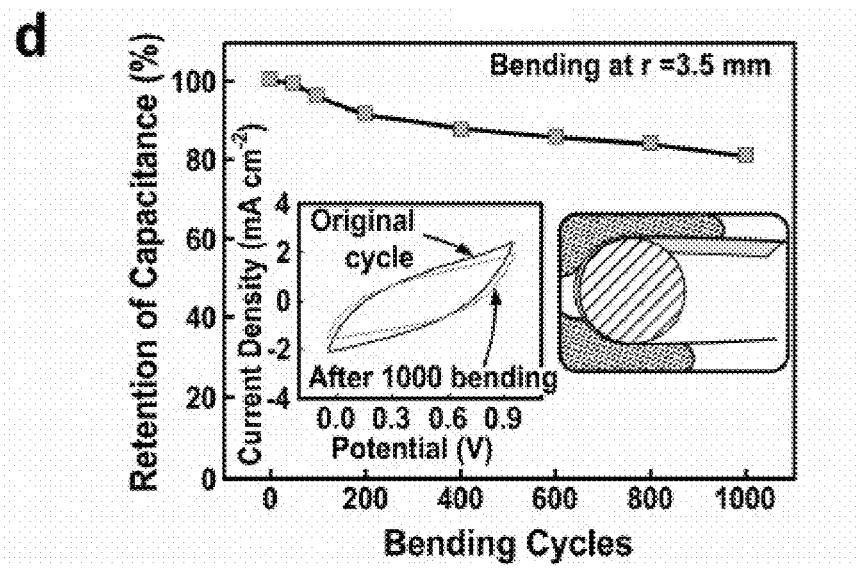
Figure 21:
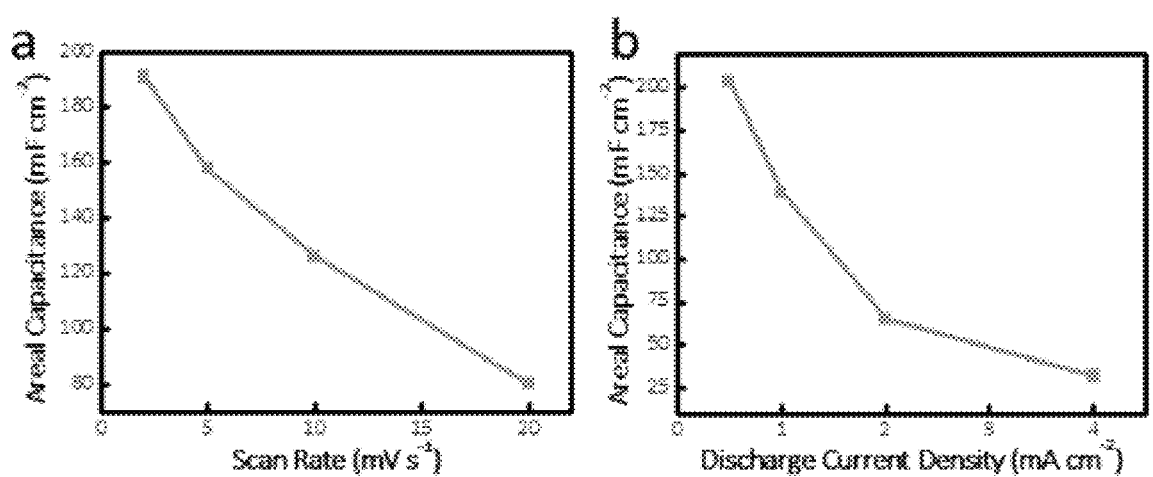
FIG. 21 includes (a) galvanostatic charging/discharging curves of RPGM-8h full cells; (b) areal capacitance versus current density of full cells made of RPGM-8h.

Cyclic Voltammogram (CV) curves are acquired from the full cell at 2 to 20 mV s$^{-1}$ [FIG. 10b and FIG. 21a]. The specific capacitances determined from the CV curves agree excellently with those determined in the aforediscussed half-cell tests. For instance, at 2 mV s$^{-1}$, the specific capacitance of 191 mF·cm$^{-2}$ obtained with a two electrode setup, corresponding to 764 mF cm$^{-2}$ in a three-electrode testing system, agrees well with that determined in the half-cell experiments (760 mF cm$^{-2}$). Consistently, an areal capacitance of 200 mF cm$^{-2}$ at a current density of 0.5 mA cm$^{-2}$, is determined by the GCD tests as shown in FIG. 10c and FIG. 21b. The areal capacitance is among the best of all reported manganese oxide foam supercapacitors, where most full-cell values are below 100 mF cm$^{-2}$.

The dendritic graphite foams disclosed herein maintain their electrical properties (capacitance, conductivity, resistance even when subjected to severe, repeated mechanical strains. For instance, supercapacitors as described above can be bent at a radius of 3.5 mm for 1,000 continuous cycles while maintaining at least 60%, 70%, 75%, 80%, 85%, 90%, or 95% capacitance relative to the initial capacitance prior to any bending. This robustness ensures the dendritic graphite foams can be advantageously deployed in flexible electronics.

Figure 11:
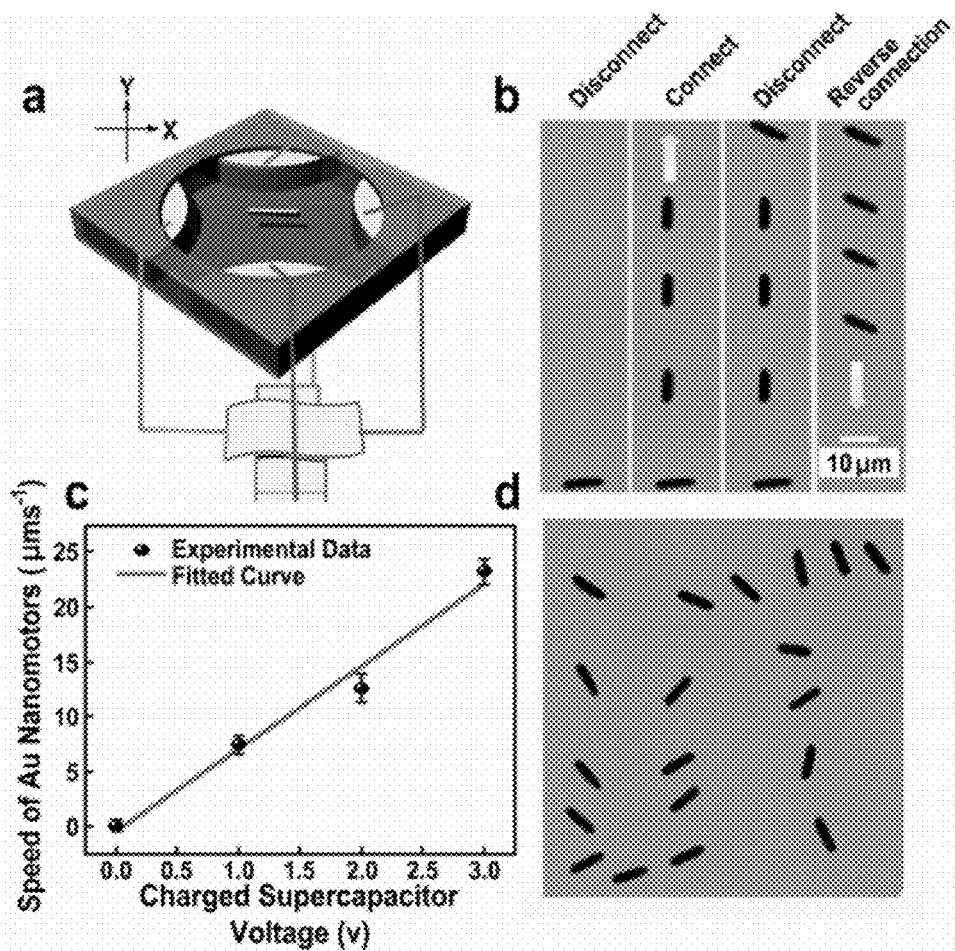
FIG. 11 includes a (a) schematic of electric nanomotors powered by flexible supercapacitors; (b) Overlapped sequential optical images of Au nanomotors powered by the supercapacitors; (c) Velocity of Au nanomotors as a function of voltages provided by the supercapacitors. (d) Trajectory of Au nanomotors powered by the flexible supercapacitors to spell letters "UT".
Figure 12A:
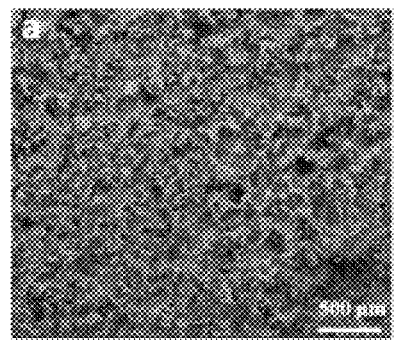
FIG. 12A, FIG. 12B, FIG. 12C, and FIG. 12D depict additional SEM images of fractally porous Cu—Ni foams.
Figure 12B:
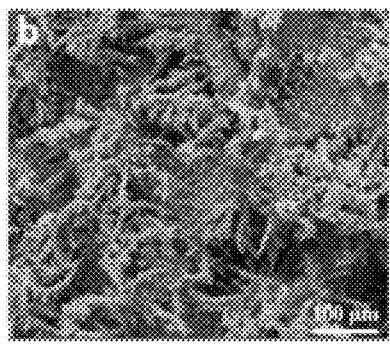
Figure 12C:
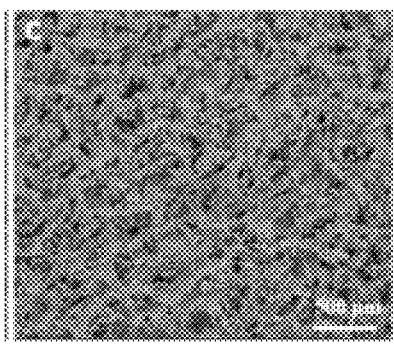
Figure 12D:
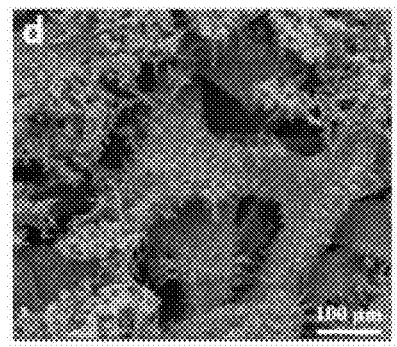
Figure 12E:
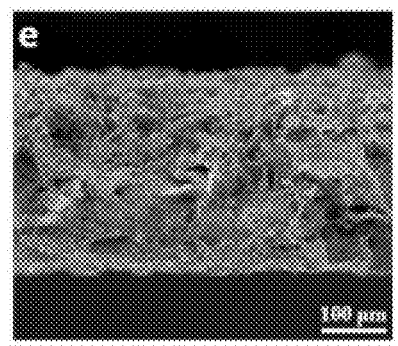
FIG. 12E and FIG. 12F depict cross-sectional images showing diverging microbranches filling the interspaces of struts of nickel foams.
Figure 12F:
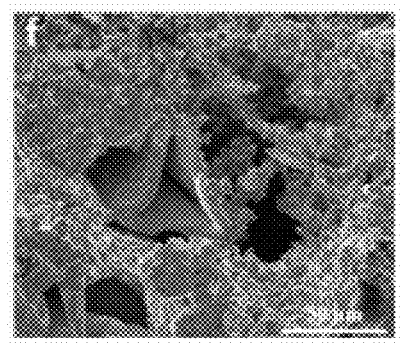
Figure 13:
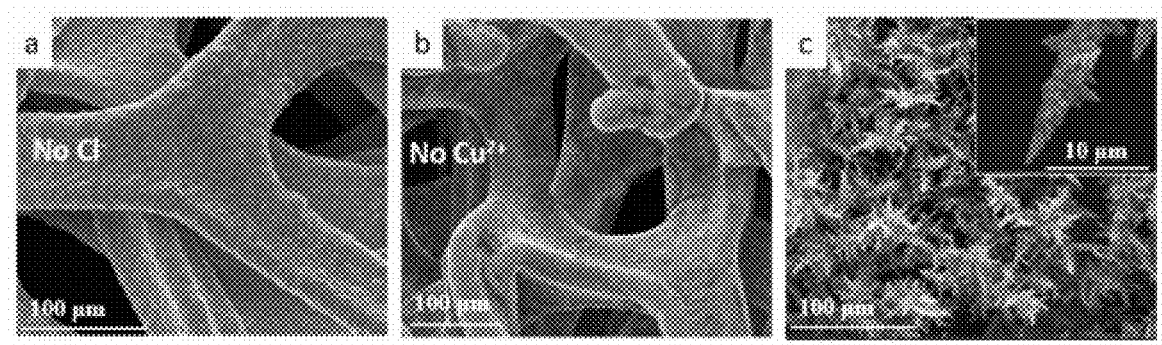
FIG. 13A includes SEM images of as-deposited materials from electrolytes made of 0.5 M nickel sulfamate, 0.1 M $NiSO_4$, 0.0025 M $CuSO_4$, 0.323 M $H_3BO_3$.
FIG. 13B includes SEM images of as-deposited materials from electrolytes made of 0.5 M nickel sulfamate, 0.1 M $NiCl_2$, 0.323 M $H_3BO_3$.
FIG. 13C includes SEM images of as-deposited materials from electrolytes made of 0.5 M nickel sulfamate, 0.1 M $NiCl_2$, 0.0025 M $CuCl_2$, 0.323 M $H_3BO_3$.
Figure 14:
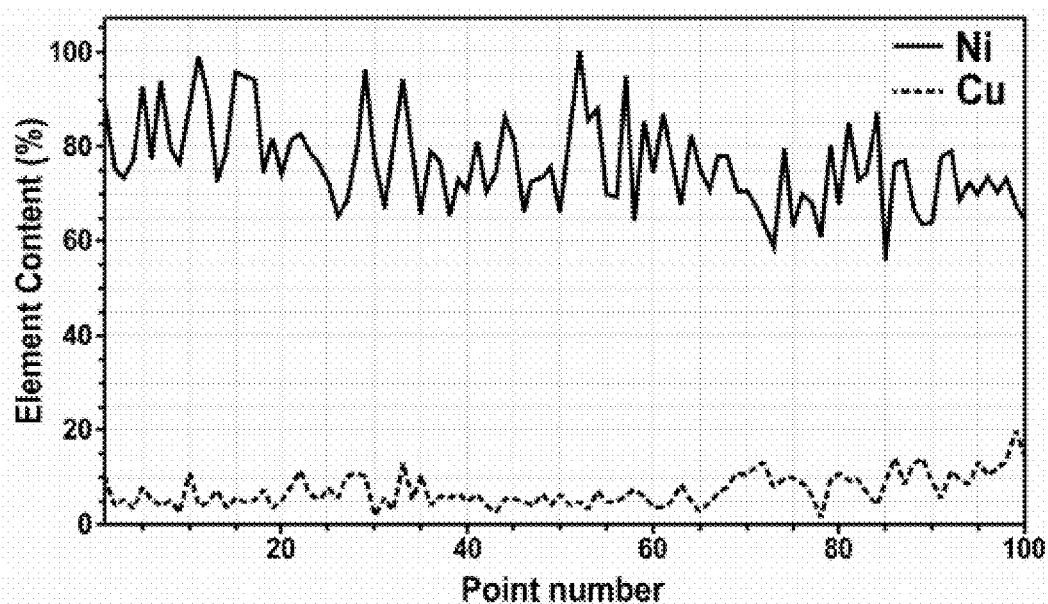
FIG. 14 includes energy-dispersive X-ray spectroscopy (EDX) of the as-deposited diverging Cu—Ni microbranches on nickel foams.
Figure 14:
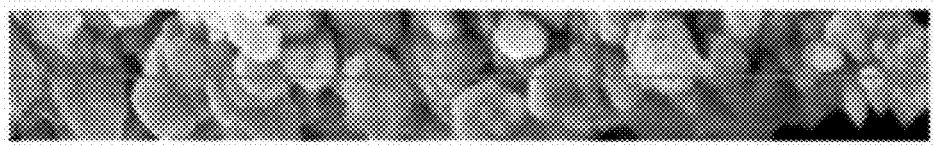
Figure 14:
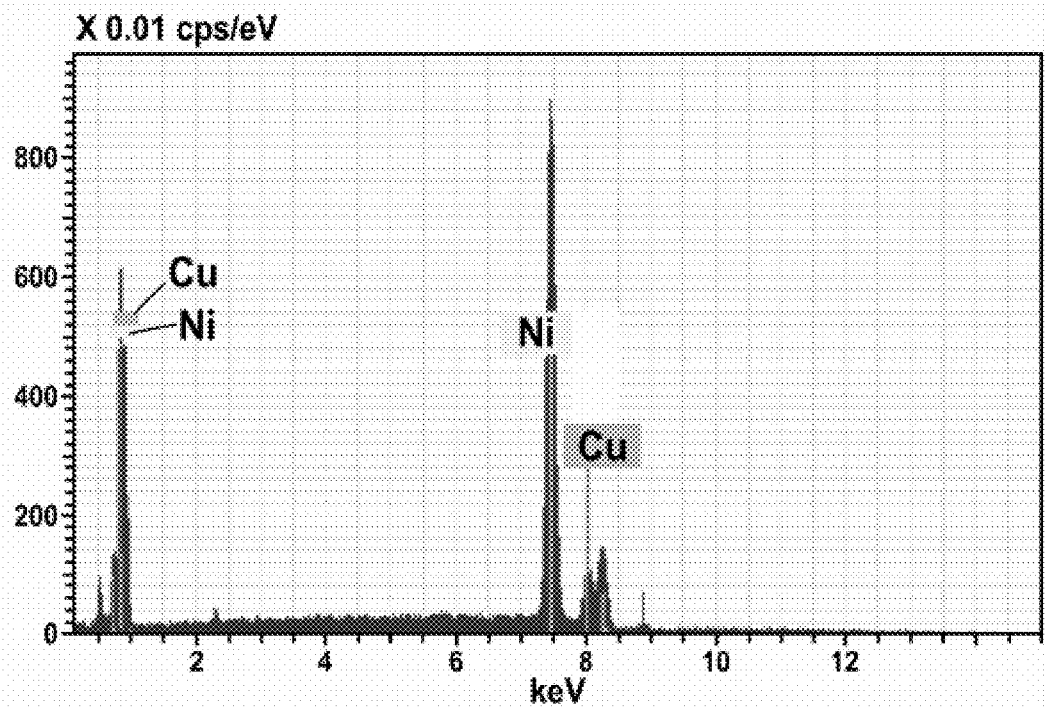
Figure 15:
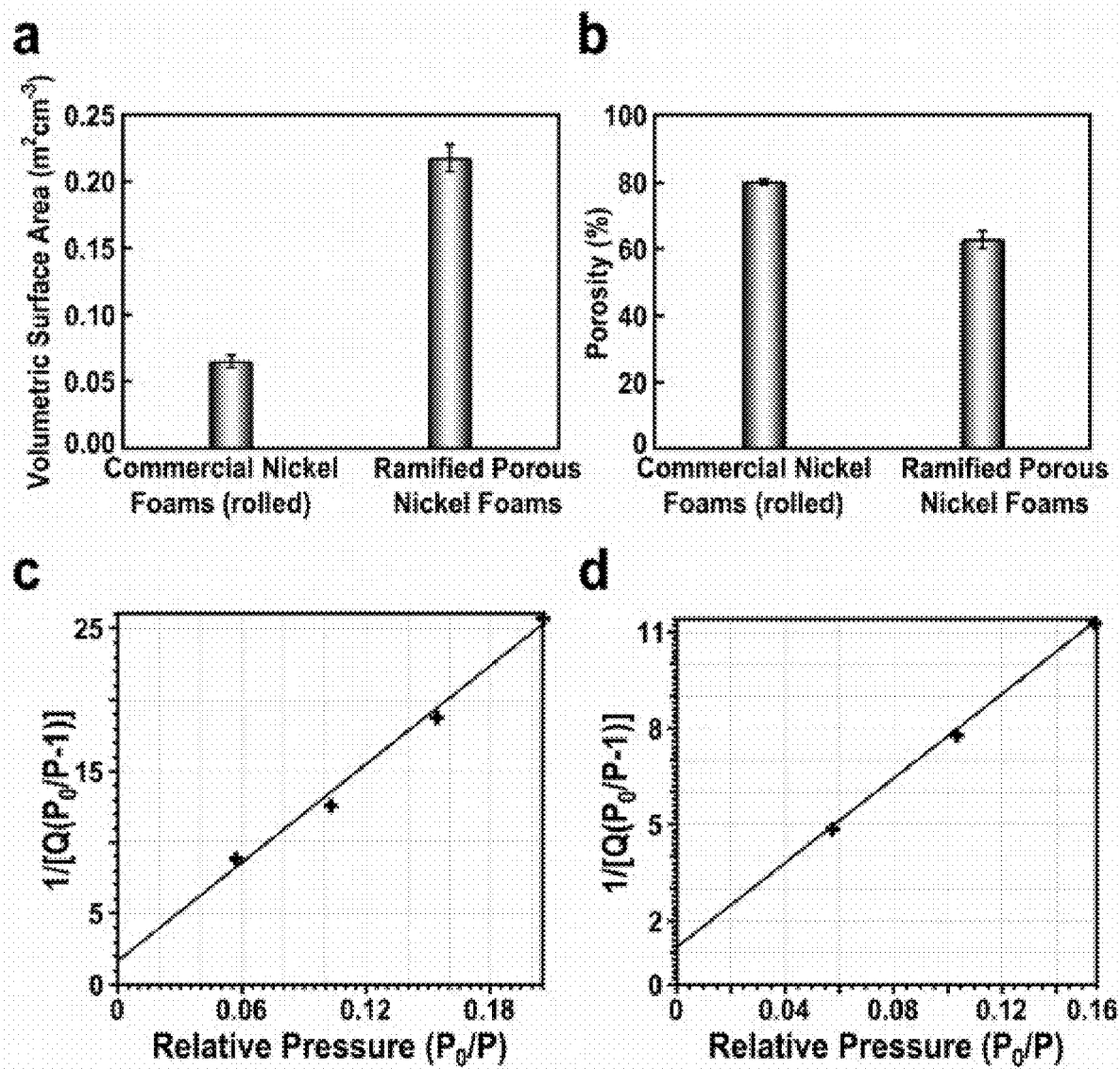
FIG. 15 includes (a) volumetric surface area and (b) porosity of rolled commercial nickel foam and ramified porous nickel foams; BET surface area plots of rolled commercial nickel foam (c), and dendritic porous nickel foams (d).
Figure 16:
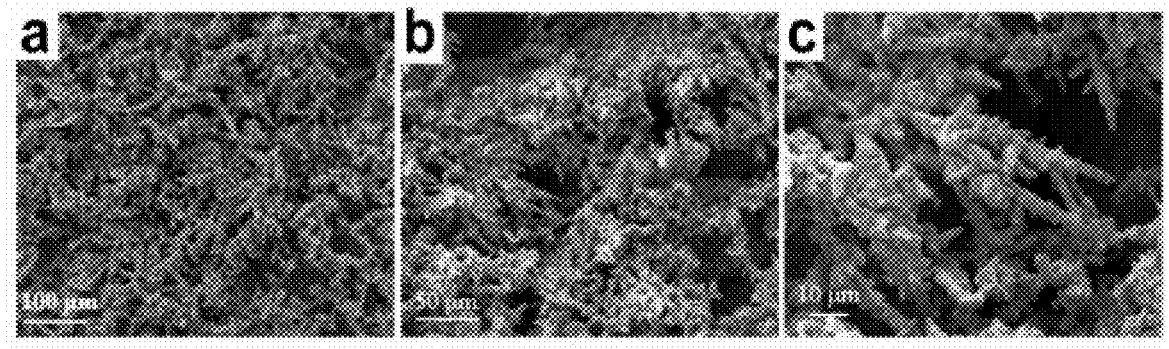
FIG. 16 includes SEM images of as-grown graphite on fractally porous Cu—Ni foams for 15 h. Here the Cu—Ni catalysts are not etched.
Figure 17:
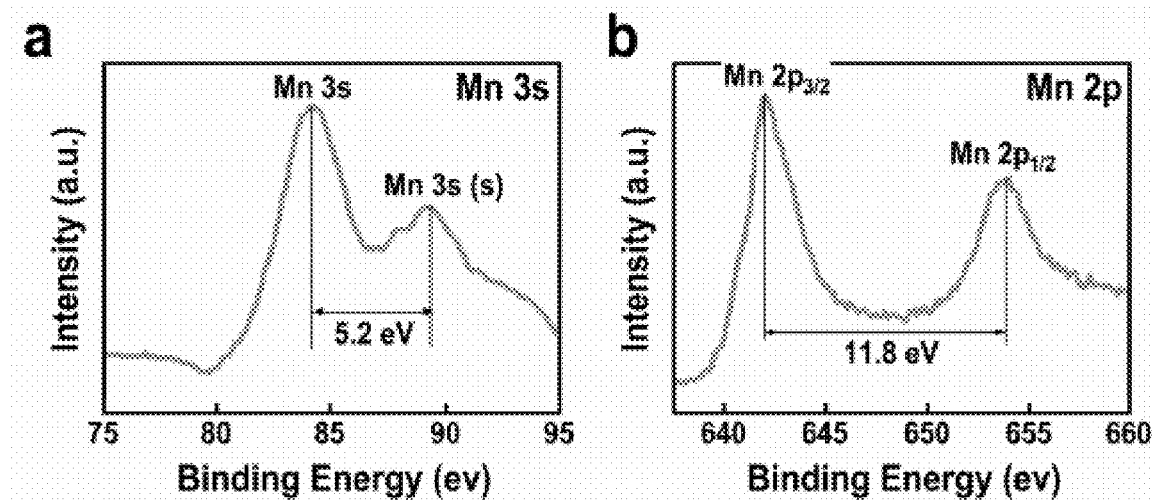
FIG. 17 includes X-ray photoelectron spectroscopy (XPS) spectra of the (a) Mn 3s region, and (b) Mn 2p region of the as-synthesized $Mn_3O_4$ on graphite foams.
Figure 18:
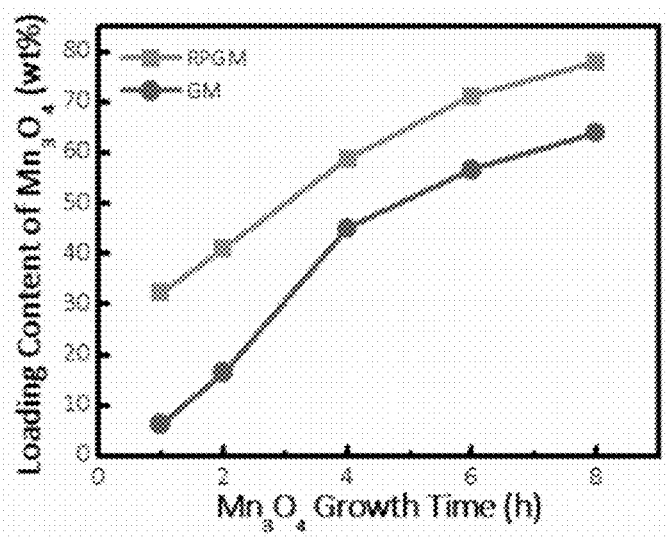
FIG. 18 depicts loading content (weight %) of $Mn_3O_4$ versus time on RPGM (squares) and GM (circles).
Figure 19:
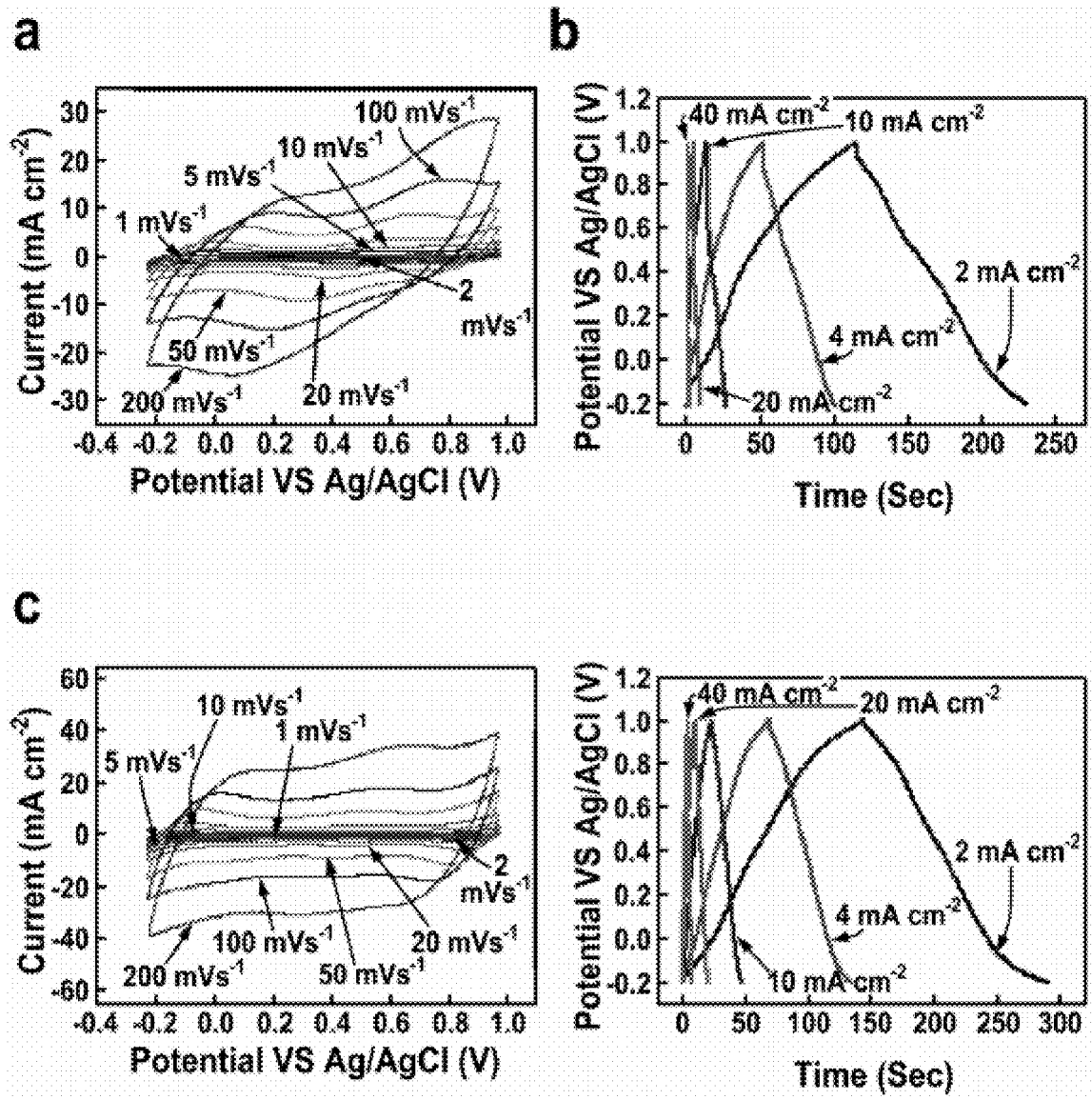
FIG. 19A depicts cyclic voltammetry (CV) of GM-4h.
FIG. 19B depicts galvanostatic charging/discharging (GCD) curves of GM-4h.
FIG. 19C depicts CV of RPGM-2h.
FIG. 19D depicts GCD curves of RPGM-2h.
Figure 20:
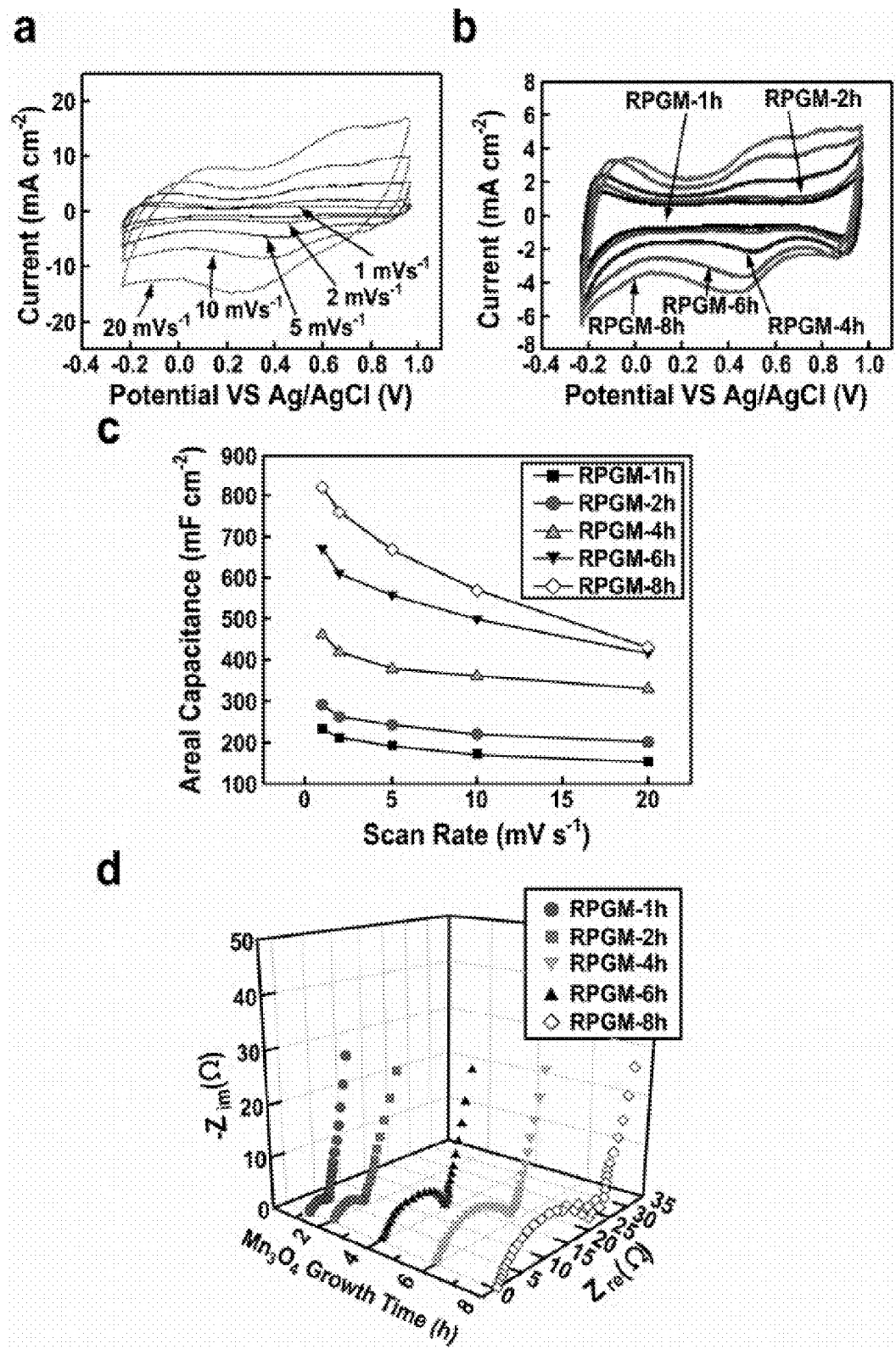
FIG. 20 includes (a) CV curves of RPGM-8h; (b) Representative CV curves of RPGM with different reaction time of $Mn_3O_4$ at a scan rate of 5 mV $s^{-1}$; (c) Areal capacitance versus scan rate and (d) EIS of RPGM with different reaction time of $Mn_3O_4$.

The dendritic graphite foams can be used to obtain self-powered and portable system for manipulation of nanomotors, i.e. to transport nanomotors made of Au with controlled speed along arbitrary trajectories. The photograph of the device and the schematic illustration of the working principle are shown in FIG. 10a and FIG. 11a, respectively. The test began with one-dimension (1D) manipulation. As shown in FIG. 11b, when the supercapacitor powered one pair of the orthogonal microelectrodes, Au nanomotor can instantly transport in the corresponding direction and then move backward upon reversion of the electric polarity. By integrating two to three supercapacitors, the applied voltages can be readily tuned to 2V and 3V, respectively, compelling the nanomotors to higher velocities than those at 1V. Analysis shows that the translational speed linearly increases with the applied voltage due to the electrostatic interactions as depicted in FIG. 11c. Next, by alternating the connections of the supercapacitors with the two orthogonal pairs of microelectrodes amidst controlled duration and sequence, two dimensional manipulation can be obtained. The self-powered device can compel Au nanomotors to trace letters "U" and "T" as shown in FIG. 11d. The demonstration of flexible all-solid-state supercapacitors for powering nanomotors evinces the potential of nanomanipulation and nanorobotics for portable and wearable applications enabled by high-performance energy devices.

EXAMPLES

The following examples are set forth below to illustrate the methods and results according to the disclosed subject matter. These examples are not intended to be inclusive of all aspects of the subject matter disclosed herein, but rather to illustrate representative methods, compositions, and results. These examples are not intended to exclude equivalents and variations of the present invention, which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures, and other reaction ranges and conditions that can be used to optimize the product purity and yield obtained from the described process. Only reasonable and routine experimentation will be required to optimize such process conditions.

Example 1: Fabrication of Porous Nickel Foam

A 4 by 2 cm$^2$ Ni foam was immersed in dilute $H_2SO_4$ (1M) for 20 min to remove the oxidized layer on the surface and then a layer of Cu was conformably electroplated on all interconnected struts of Ni foam at a current of −700 mA for 800 coulombs in an electrolyte made of 2 M $CuSO_4$ and 1 M $HBO_3$. Next, the Cu—Ni composite was dried and annealed in nitrogen (50 SCCM) and hydrogen (5 SCCM) gas atmosphere at the temperature of 1000° C. for 5 min for interfacial atomic diffusion. The deposited Cu—Ni was then partially electrochemically etched from the obtained Cu—Ni alloy foam at current of 350 mA in the same electrolyte for 350 coulombs, resulting in arrays of second-level micropores of ~2 μm on the surface of Cu—Ni alloy foam networks (porous Ni foam).

Example 2: Direct Growth of Ni Dendrites on Planar Substrates or 3-D Ni Foams

A planar conducting substrate, such as Ni and Cu foils, or a 3-D Ni foam was immersed in 1M $H_2SO_4$ to remove the oxide layer and then transferred to Ni—Cu electrolyte (0.1 M nickel chloride, 0.5 M nickel sulfamate, 0.0025 M copper chloride and 0.323 M boric acid). After electrodeposition at a current of −350 mA for 150 coulombs, the sample was turned upside down, and the surface pointing to the reference electrode was also reversed. Then another deposition is continued. Totally four such depositions were carried out on each sample. Next, the obtained Ni—Cu dendrites on porous nickel foam were enforced by annealing in nitrogen (50 SCCM) and hydrogen (5 SCCM) gas atmosphere at the temperature of 1000° C. for 5 min.

Example 3: Direct Growth of Ni Dendrites on Porous Nickel Foam

The obtained porous nickel foam from Example 1 was immersed in 1M $H_2SO_4$ to remove the oxide layer and then transferred to Ni—Cu electrolyte (0.1 M nickel chloride, 0.5 M nickel sulfamate, 0.0025 M copper chloride and 0.323 M boric acid). After electrodeposition at a current of −350 mA and 150 coulombs, the sample was turned upside down, and the surface pointing to the reference electrode was also reversed. Totally four such depositions are carried out on each sample. Next, the obtained Ni—Cu dendrites on porous nickel foam were enforced by annealing in nitrogen (50 SCCM) and hydrogen (5 SCCM) at the temperature of 1000° C. for 5 min, resulting in a three-dimensional (3-D) porous nickel foam with hierarchical dendrites and micropores (dendritically porous nickel foam).

Example 4: Synthesis of Graphite on Dendritic Structures

A piece of dendritic nano structures from Examples 1, 2 and 3 were loaded into a stable heating zone of a quartz tube furnace at 700° C. in the flow of $H_2$ (20 SCCM) for 40 min to clean the surface. Then $C_2H_4$ (10 SCCM) was introduced into the reaction zone to grow graphite on the Ni catalysts for 2.5-15 hour. Next, the sample was slowly cooled to the ambient temperature and then immersed into the mixed solution of 1 M iron chloride ($FeCl_3$) and 2 M hydrochloride (HCl) at room temperature for overnight etching. After rinsing the sample with deionized water several times and drying at 60° C. for 4 hours, a freestanding flexible dendritically porous graphite (GF) thin film (or 3-D foam) was obtained.

Example 5: Loading of Active Materials

After the growth of $Mn_3O_4$ for 1 hour, dendritically porous graphite retains 0.569 mg/cm² $Mn_3O_4$. In contrast, non-porous graphite retained only 0.076 mg/cm² $Mn_3O_4$. Porous graphite prepared as described in 2015/0360952 retained 0.284 mg/cm² $Mn_3O_4$.

Compared to non-porous graphite, dendritically porous graphite) can substantially increase the volumetric capacitance from 0.062 F/cm² to 0.213 F/cm² [$Mn_3O_4$ loading duration (1 hr)]. The specific capacitance is also increased from 164 to 260 F/g (1 mV/sec). Comparing to the porous graphite disclosed in US 2015/0360952 the dendritically porous graphite can substantially increase the volumetric capacitance from 0.124 F/cm² to 0.213 F/cm² [porous GF of the same areal density of GF (0.249 mg/cm²) and reaction time of $Mn_3O_4$ (1 hr)]. The specific capacitance is also increased from 232 to 260 F/g.

|  | Non-porous Graphite (5 hr) | Pourous Graphite (5 hr) | Dendritically Porous Graphite (1.5 hr) |
|---|---|---|---|
| $Mn_3O^4$ Reaction Time |  | 1 hr |  |
| $Mn_3O^4$ (mg/cm2) | 0.076 | 0.284 | 0.569 |
| GF (mg/cm2) | 0.302 | 0.249 | 0.249 |
| $Mn_3O^4$ @ GF (mg/cm2) | 0.378 | 0.533 | 0.818 |
| Specific capacitance (F/g) @ 1 mV/s | 164 | 232 | 260 |
| Volumetric capacitance (F/cm²)@ 1 mV/s | 0.062 | 0.124 | 0.213 |

Example 7: Synthesis of Porous Cu—Ni Foams

A piece of rolled commercial nickel foam (2.5×4 cm², 200 µm in thickness, MTI Corporation, CA, USA) was soaked in sulfuric acid ($H_2SO_4$, 1M) for 20 min to remove the native nickel oxide layer. Then, a thin layer of Cu film was electroplated at −1.8V (vs. Ag/AgCl) for 800 coulombs from an electrolyte made of copper sulfate ($CuSO_4$, 2M) and boric acid ($H_3BO_3$, 1M) with copper foil serving as the counter electrode (MTI Corporation, CA, USA). Next, the Cu—Ni composite foams were annealed at a temperature of 1000° C. in a gas flow of hydrogen ($H_2$, 5 sccm) and nitrogen ($N_2$, 50 sccm) at 420 mTorr for 5 min. Finally, the annealed composite was electrochemically etched at +0.6 V (vs. Ag/AgCl) in the same electrolyte for 350 coulombs, resulting in large arrays of micropores uniformly distributed on the interconnected microstruts of the foam.

Example 8: Synthesis Cu—Ni Dendrites on Porous Cu—Ni Foams

The diverging Cu—Ni dendrites were electrodeposited on the obtained porous Cu—Ni foams at a potential of −1.2 V (vs. Ag/AgCl) for 150 coulombs from an electrolyte made of nickel sulfamate [$Ni(SO_3NH_2)_2$, 0.5M], nickel chloride ($NiCl_2$, 0.1M), copper chloride ($CuCl_2$, 0.0025M), and boric acid ($H_3BO_3$, 0.323M) with nickel foil (Alfa Aesar, MA, USA) working as the counter electrode. The electrodeposition was sequentially repeated four times with the porous Cu—Ni foam substrate rotated upside-down each time to ensure an even coverage of the dendrites. The electrolyte was also replaced every two depositions to replenish the copper ions available for the formation of diverging branches. Upon completion of all four electrodepositions, the Cu—Ni foams were rinsed with deionized water and annealed at 1000° C. in a gas mixture ($H_2$, 5 sccm and $N_2$, 50 sccm) for 5 min to enhance the adhesion between the Cu—Ni dendrites and Cu—Ni foam struts.

Example 9: Growth of Dendritic Porous Graphite Foams

Rolled commercial nickel foams (200 µm in thickness) or the dendritic porous Cu—Ni foams were annealed in hydrogen ($H_2$) gas flow (20 sccm) at 700° C. for 40 minutes for the removal of surface oxides. Then ethylene ($C_2H_4$, 10 sccm) was introduced to grow ultrathin graphite on the nickel foam at a total pressure of 400 mTorr for controlled growth of graphite. The reaction time was 30 h for commercial foam and 15 h for dendritic foam to obtain identical areal mass density of ~1 mg cm$^{-2}$ for each type of samples. Next, the temperature was rapidly reduced to room temperature in the original growth gas mixture. By selectively etching Ni or Cu—Ni alloy catalysts in a mixture of iron chloride ($FeCl_3$, 1 M) and hydrochloric acid (HCl, 2 M) at 60° C. overnight, free-standing graphite foams were obtained. Afterwards, the ultrathin graphite foam was rinsed with deionized water and ethanol for a few times, and finally dried at 60° C. for 4 hr.

Example 10: Growth of $Mn_3O_4$

A 1 by 2 cm² graphite foam, prepared in Example 9, was immersed in 4 M $HNO_3$ at 50° C. for two hours to activate the surface of the graphite to be hydrophilic. Then the samples were washed with deionized water and dried at 60° C. for 6 hours. Next, potassium permanganate ($KMnO_4$, 0.1 M) and sodium nitrate ($NaNO_3$, 0.1 M) was mixed in a 1:1 ratio under vigorous stirring. Subsequently, the well-mixed solution (30 mL) was transferred into an autoclave and heated to 150° C. for the preset time (1, 2, 4, 6, 8 h). Finally, the obtained graphite/$Mn_3O_4$ foams was washed with deionized water several times before dried at 60° C. for 10 hours.

Example 11: Assembly of all-Solid-State Dendritic Graphite Foam Supercapacitors

A dendritic graphite foam (8 h) sample (1 by 2 cm² in area) was affixed to Au (100 nm) coated polyester (PET) film (0.08 mm thickness, ePlastics, CA, USA) with silver epoxy, serving as a half electrode. Then, a LiCl/PVA (polyvinylalcohol) (mass ratio, 8.5:4) gel electrolyte was infiltrated to the RPGM/Au-PET composite followed by 20 min of degassing. Finally, two pieces of RPGM/Au-PET was sandwiched together, followed by drying in an oven at 50° C. overnight, to form an all-solid-stated symmetric supercapacitor.

Example 12: Fabrication of Nanomanipulation Device and Au Nanomotors

The quadruple microelectrodes with a gap of ~500 µm were patterned by photolithography. The microelectrodes are made of Au (90 nm)/Cr (10 nm) thin films. The Au nanowires were electrodeposited into nanoporous anodized aluminum oxide and the length of Au nanowires was controlled by the amount of electric charges passing through the circuit.

Example 13: Materials Characterization

The CV, GCD and EIS of GMs, and RPGMs half-cell tests was carried out in a three-electrode cell setup with sodium sulfate (1M $Na_2SO_4$) as the electrolyte, platinum foil as a counter electrode, and Ag/AgCl as a reference electrode. The EIS spectra was tested from 100 kHz to 0.01 Hz. SEM images were recorded by Hitachi S-5500 and FEI Quanta 650 scanning electron microscopes. Transmission electron microscopy (TEM) images were recorded by a high-resolution TEM JEOL 2010F. X-ray diffraction (XRD) patterns were recorded by Philips XPERT Theta-Theta Diffractometer. Raman spectra were recorded by a customized micro-Raman system with a laser of 532 nm. The specific surface areas were measured with the 5-point Brunauer, Emmett and Teller (BET) method (Pacific Surface Science Inc., Oxnard, CA). All the materials were weighed on a high precision electronic balance (CAHN-C30). The mass loading of $Mn_3O_4$ was measured by weighing the mass difference before and after the growth of $Mn_3O_4$ on graphite foams.

| Material | Mass loading (mg $cm^{-2}$) | Mass content (wt %) | Loading method | Electrode Support (mg $cm^{-2}$) | Ref. |
|---|---|---|---|---|---|
| Graphene/$Mn_3O_4$ powder | 2.0 | 4.8 | 4 h hydrothermal reaction, then pasted on Nickel foam | Nickel foam (40) | Lee, J. W. (2012)[4] |
| $MnO_2$/CNT/Graphene foam | Not mentioned | 8 | 3 h hydrothermal reaction | Nickel foam | Zhu, G. (2014)[5] |
| $Mn_3O_4$/RGO | 1-1.5 | 3.6 | 4 h CVD, then coated on Nickel foam | Nickel foam (40) | Yang, X. (2016)[6] |
| $MnO_2$/graphene foam | Not mentioned | 92.3 | 6 h Hydrothermal reaction | Graphene foam | Dong, X. (2012)[7] |
| 3D graphene/$MnO_2$ composite | 9.8 / 5.0 | 92.8 / 90 | 23 h electrodeposition / 12 h electrodeposition | Graphite foam (0.7-0.75) | He, Y (2013)[8] |
| Graphene foam/CNT/$MnO_2$ | 6.2 / 3.9 | 88.6 / 83.0 | 6 h hydrothermal reaction / 6 h hydrothermal reaction w/lower concentration | Graphene foam (0.8) | Liu, J (2014)[3] |
| Graphite foam/$Co_3O_4$/PEDOT-$MnO_2$ | 2.1 (PEDOT-$MnO_2$) | 95 | 450 s electrodeposition | Graphite foam with reduced pore size (0.1) | Xia, X (2014)[9] |
| Graphite foam/$MnO_2$ | 1.0 | 13 | 3 h Hydrothermal reaction | Graphite foam | Sun, X. (2014)[10] |
| Multilevel porous Graphite foam/$Mn_3O_4$ Nanocrystals | 0.29 | 65.9 | 1 h Hydrothermal reaction | Porous Graphite foam (0.15) | Li, W (2017)[11] |
| Graphene foam/PPy/$MnO_2$ | 0.25 | 21 | 80 min Hydrothermal reaction | Graphene foam (0.86) | Qin, T (2016)[12] |
| Porous Graphite foams with diverging microtubes/$Mn_3O_4$ Nanocrystals (This work) | 3.91 | 78 | 8 h Hydrothermal Reaction | Ramified Porous Graphite foam (1.1) | This work |

| Material | Areal Capacitance (mF $cm^{-2}$) | | Gravimetric capacitance* (F $g^{-1}$) | Demonstrated applications | Ref. |
|---|---|---|---|---|---|
| | Half cell | Symmetric full cell | | | |
| Graphene/$Mn_3O_4$ powder | 228 (5 mV $s^{-1}$) | Not mentioned | 114 (5 mV $s^{-1}$) ** −0.1-0.7 V VS Ag/AgCl | No | Lee, J. W. (2012)[4] |
| $MnO_2$/CNT/Graphene foam | Not mentioned | 27 F $g^{-1}$ (10 mV $s^{-1}$) | 251 (1 A $g^{-1}$) ** −0.2-0.8 V | Light, light-emitting diode (LED) | Zhu, G. (2014)[5] |
| $Mn_3O_4$/RGO | 517 (1 A $g^{-1}$) | Not mentioned | 517 (1 A $g^{-1}$)** −0.9-0.1 V VS Ag/AgCl | No | Yang, X. (2016)[6] |
| $MnO_2$/graphene foam | Not mentioned | Not mentioned | 250 (1.2 A $g^{-1}$) 0-0.5 V VS Ag/AgCl, big IR drop when charging to 1.0 V | No | Dong, X. (2012)[7] |
| 3D graphene/$MnO_2$ composite | 1420 (2 mV $s^{-1}$) 500 (20 mV $s^{-1}$) 35.2% retention at 20 mV $s^{-1}$ 750 (2 mV $s^{-1}$) 300 (20 mV $s^{-1}$) 40% retention at 20 mV $s^{-1}$ | 30 (0-1.0 V, 0.3 mA $cm^{-2}$) w/0.4 mg $cm^{-2}$ loading | 130 (2 mV $s^{-1}$) 0-1.0 V VS Ag/AgCl Not mentioned | Flexible supercapacitors | He, Y (2013)[8] |

-continued

| Material | Col2 | Col3 | Col4 | Application | Reference |
|---|---|---|---|---|---|
| Graphene foam/CNT/MnO$_2$ | 750 (5 mV s$^{-1}$) 280 (20 mV s$^{-1}$) 37.3% retention at 20 mV s$^{-1}$ 500 (5 mV s$^{-1}$) 250 (20 mV s$^{-1}$) 50% retention at 20 mV s$^{-1}$ | Only demonstrated asymmetric supercapacitors w/ 2.1 mg cm$^{-2}$ loading due to large electric resistance | 80 (5 mV s$^{-1}$) 0-1.0 V VS Ag/AgCl 128 (5 mV s$^{-1}$) | Power LEDs | Liu, J (2014)[3] |
| Graphite foam/Co$_3$O$_4$/PEDOT-MnO$_2$ | Not mentioned | | | Power LEDs | Xia, X (2014)[9] |
| Graphite foam/MnO$_2$ | 210 (2 A g$^{-1}$) | Not mentioned | 210 (2 A g$^{-1}$) On MnO$_2$ 0-0.9 VS Ag/AgCl | No | Sun, X. (2014)[10] |
| Multilevel porous Graphite foam/Mn$_3$O$_4$ Nanocrystals | 114 (1 mV s$^{-1}$) | 52 (0-1.0 V, 10 mV s$^{-1}$) w/0.29 mg cm$^{-2}$ | 260 (1 mV s$^{-1}$) -0.2-1.0 VS Ag/AgCl | Self-powered strain sensors | Li, W (2017)[11] |
| Graphene foam/PPy/MnO$_2$ | 150 (5 mV s$^{-1}$) | 40 (0-10 V, 10 mV s$^{-1}$) w/0.25 mg cm$^{-2}$ | 126 (5 mV s$^{-1}$) | Flexible supercapacitors | Qin, T (2016)[12] |
| Porous Graphite foams with diverging microtubes/Mn$_3$O$_4$ Nanocrystals (This work) | 820 (1 mV s$^{-1}$) 760 (2 mV s$^{-1}$) 670 (5 mV s$^{-1}$) 570 (10 mV s$^{-1}$) 430 (20 mV s$^{-1}$) High rate capability (52.4% retention at 20 mV s$^{-1}$) | 191 (2 mV s$^{-1}$) 126 (10 mV s$^{-1}$) 204 (.5 mA cm$^{-2}$) (0-1.0 V) w/3.91 mg cm$^{-2}$ | 164 (1 mV s$^{-1}$) -0.2-1.0 V VS Ag/AgCl | Self-powered and portable nanomotor manipulation system | This work |

[1] Z. Li; J. Wang; X. Liu; S. Liu; J. Ou; S. Yang, *J. Mater. Chem.* 2011, 21, 3397
[2] Y. Cheng; S. Lu; H. Zhang; C. V. Varanasi; J. Liu, *Nano Lett.* 2012, 12 4206
[3] J. Liu; L. Zhang; H. B. Wu; J. Lin; Z. Shen; X. W. Lou, *Energy Environ. Sci.* 2014, 7, 3709
[4] J. W. Lee; A. S. Hall; J.-D. Kim; T. E. Mallouk, *Chem. Mater.* 2012, 24, 1158
[5] G. Zhu; Z. He; J. Chen; J. Zhao; X. Feng; Y. Ma; Q. Fan; L. Wang; W. Huang, *Nanoscale* 2014, 6, 1079
[6] X. Yang; Y. He; Y. Bai; J. Zhang; L. Kang; H. Xu; F. Shi; Z. Lei; Z.-H. Liu, *Electrochim. Acta* 2016, 188, 398
[7] X. Dong; X. Wang; J. Wang; H. Song; X. Li; L. Wang; M. B. Chan-Park; C. M. Li; P. Chen, *Carbon* 2012, 50, 4865
[8] Y. He; W. Chen; X. Li; Z. Zhang; J. Fu; C. Zhao; E. Xie, *ACS Nano* 2013, 7, 174
[9] X. Xia; D. Chao; Z. Fan; C. Guan; X. Cao; H. Zhang; H. J. Fan, *Nano Lett.* 2014, 14, 1651
[10] X. Sun; H. Wang; Z. Lei; Z. Liu; L. Wei, *RSC Adv.* 2014, 4 30233
[11] W. Li; X. Xu; C. Liu; M. C. Tekell; J. Ning; J. Guo; J. Zhang; D. L. Fan, *Adv. Funct. Mater.* 2017, 27, 1702738
[12] T. Qin; B. Liu; Y. Wen; Z. Wang; X. Jiang; Z. Wan; S. Peng; G. Cao; D. He, *J. Mater. Chem. A* 2016, 4, 9196

The compositions and methods of the appended claims are not limited in scope by the specific compositions and methods described herein, which are intended as illustrations of a few aspects of the claims and any compositions and methods that are functionally equivalent are intended to fall within the scope of the claims. Various modifications of the compositions and methods in addition to those shown and described herein are intended to fall within the scope of the appended claims. Further, while only certain representative compositions and method steps disclosed herein are specifically described, other combinations of the compositions and method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated. The term "comprising" and variations thereof as used herein is used synonymously with the term "including" and variations thereof and are open, non-limiting terms. Although the terms "comprising" and "including" have been used herein to describe various embodiments, the terms "consisting essentially of" and "consisting of" can be used in place of "comprising" and "including" to provide for more specific embodiments of the invention and are also disclosed. Other than in the examples, or where otherwise noted, all numbers expressing quantities of ingredients, reaction conditions, and so forth used in the specification and claims are to be understood at the very least, and not as an attempt to limit the application of the doctrine of equivalents to the scope of the claims, to be construed in light of the number of significant digits and ordinary rounding approaches.

What is claimed is:

1. A method of making a dendritically porous three-dimensional graphite foam comprising:
    (a) placing a conductive substrate in an electrolyte solution, wherein the electrolyte solution is in electrical communication with an electrode;
    (b) applying an electric current via the electrode sufficient to grow metal dendrites on the surface of the conductive substrate;
    (c) annealing the metal dendrites and conductive substrate;
    (d) depositing carbon upon the annealed metal dendrites and the conductive substrate;
    (e) removing the annealed metal dendrites and conductive substrate to obtain a three-dimensional graphite foam comprising porous graphite dendrites radiating from a porous core.

2. The method of claim 1, wherein the conductive substrate comprises a conductive metal, silicon, or a conductive polymer.

3. The method of claim 2, wherein the conductive substrate comprises a metal foam.

4. The method of claim 3, wherein the conductive substrate comprises a nickel foam, a copper foam, an iron foam, a zinc foam, an aluminum foam, or a tin foam.

5. The method of claim 1, wherein the electrolyte solution comprises a copper salt, a nickel salt, a cobalt salt, or a mixture thereof.

6. The method of claim 1, wherein the applied electric current is at least −25 mA.

7. The method of claim 1, wherein the electric current is applied at an applied voltage from −2.5 V-2.5 V.

8. The method of claim 1, wherein the electric current is applied to the conductive substrate from 25-500 $C/in^2$, relative to the surface area of the conductive substrate.

9. The method of claim 1, wherein step (b) comprises:
(b1) applying an electric current via the electrode sufficient to grow metal dendrites on the surface of the conductive substrate;
(b3) rotating the metal substrate relative to the electrode; and
(b2) applying an electric current via the electrode sufficient to grow metal dendrites on the surface of the rotated conductive substrate.

10. The method of claim 9, comprising multiple rotation-dendrite growth sequences.

11. The method of claim 1, wherein the depositing step comprises chemical vapor deposition or hydrothermal synthesis using a carbon source.

12. The method of claim 11, wherein the carbon source comprises a $C_{2-4}$ hydrocarbon.

13. The method of claim 11, wherein the depositing step is conducted at a temperature less than about 1,000° C.

14. The method of claim 11, wherein the depositing step is conducted at a temperature between about 500-1,000° C.

15. The method according to claim 1, wherein the conductive substrate is removed by chemical etching.

16. The method according to claim 15, wherein the chemical etching comprises treatment with at least one acid.

17. The method according to claim 15, wherein the chemical etching comprises a treatment with a mineral acid and a Lewis acid.

18. The method according to claim 17, wherein the mineral acid comprises HCl, HBr, HI, HF, $HNO_3$, $H_2SO_4$, $H_3PO_4$, or a mixture thereof.

19. The method according to claim 17, wherein the Lewis acid comprises a transition metal salt.

* * * * *